(12) United States Patent
Berdy et al.

(10) Patent No.: US 12,267,099 B2
(45) Date of Patent: Apr. 1, 2025

(54) DYNAMIC RADIO FREQUENCY LOADING CHANGE MITIGATION

(71) Applicant: QUALCOMM Incorporated, San Diego, CA (US)

(72) Inventors: David Francis Berdy, San Diego, CA (US); Jin Cho, San Diego, CA (US); Yu Steve Zhao, San Diego, CA (US); Christian Holenstein, La Mesa, CA (US); Ryan Scott Castro Spring, San Diego, CA (US); Jose Cabanillas, San Diego, CA (US); Euichan Moon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 358 days.

(21) Appl. No.: 17/655,351

(22) Filed: Mar. 17, 2022

(65) Prior Publication Data
US 2023/0299808 A1    Sep. 21, 2023

(51) Int. Cl.
*H04B 1/40* (2015.01)
*H03H 1/00* (2006.01)

(52) U.S. Cl.
CPC ............. *H04B 1/40* (2013.01); *H03H 1/0007* (2013.01)

(58) Field of Classification Search
CPC .. H03H 7/38; H03H 9/70; H03H 7/46; H03H 11/344; H03H 7/0161; H03H 7/465; H03H 9/0004; H03H 9/24; H03H 9/14597; H03H 7/463; H03H 9/0566; H03H 9/706; H03H 9/725; H03H 9/25; H04B 1/006; H04B 1/40; H04B 1/48; H04B 1/0057; H04B 1/44; H04B 1/0458; H04B 1/525; H04B 1/38; H04B 1/0483
USPC .......................................................... 455/73
See application file for complete search history.

(56) References Cited

U.S. PATENT DOCUMENTS

| 10,623,027 | B2 | 4/2020 | Bai |
| 2010/0099366 | A1* | 4/2010 | Sugar .................. H04B 7/0413 455/75 |
| 2018/0227006 | A1 | 8/2018 | Yasuda |
| 2020/0127698 | A1 | 4/2020 | Cho et al. |
| 2023/0318642 | A1* | 10/2023 | Uejima ................ H04B 1/0483 455/103 |

FOREIGN PATENT DOCUMENTS

WO    2021215550 A1    10/2021

OTHER PUBLICATIONS

International Search Report and Written Opinion—PCT/US2023/063274—ISA/EPO—Aug. 30, 2023.

(Continued)

*Primary Examiner* — Ajibola A Akinyemi
(74) *Attorney, Agent, or Firm* — Loza & Loza LLP

(57) ABSTRACT

In certain aspects, a system includes a first filter, a second filter, a dummy load, and a switching circuit coupled to the first filter, the second filter, and the dummy load, and coupled to a first antenna and a second antenna. In a first mode, the switching circuit couples the first filter and the second filter to the first antenna, and, in a second mode, the switching circuit couples the first filter and the third filter to the first antenna and couples the second filter to the second antenna. In certain aspects, the dummy load includes a third filter.

17 Claims, 20 Drawing Sheets

(56) References Cited

OTHER PUBLICATIONS

Qualcomm Incorporated: "4RX SRS Switching", 3GPP TSG-RAN WG4#84, R4-1708610 4RX SRS, 3rd Generation Partnership Project (3GPP), Mobile Competence Centre, 650, Route Des Lucioles, F-06921 Sophia-Antipolis Cedex, France, vol. RAN WG4, No. Berlin, DE, Aug. 21, 2017-Aug. 25, 2017, 4 Pages, Aug. 20, 2017 (Aug. 20, 2017), XP051321713, paragraph [02.1].
Partial International Search Report—PCT/US2023/063274—ISA/EPO—Jun. 20, 2023.

\* cited by examiner

DYNAMIC RADIO FREQUENCY LOADING CHANGE MITIGATION

BACKGROUND

Field

Aspects of the present disclosure relate generally to wireless communications, and, more particularly, to switching in a wireless device.

Background

A wireless device may include multiple antennas for transmitting and/or receiving radio frequency (RF) signals. The wireless device may also include multiple filters (e.g., bandpass filters) to transmit and/or receive RF signals in different frequency bands. The wireless device may also include a switching circuit between the antennas and the filters, in which the switching circuit is used to couple the antennas and the filters in any one of multiple configurations.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a first filter, a second filter, a third filter, and a switching circuit having a first terminal, a second terminal, a third terminal, a fourth terminal, and a fifth terminal, wherein the first terminal is coupled to the first filter, the second terminal is coupled to the second filter, the third terminal is coupled to a first antenna, the fourth terminal is coupled to a second antenna, and the fifth terminal is coupled to the third filter. In a first switch configuration, the switching circuit is configured to couple the first terminal to the third terminal, and couple the second terminal to the third terminal. In a second switch configuration, the switching circuit is configured to couple the first terminal to the third terminal, couple the second terminal to the fourth terminal, and couple the fifth terminal to the third terminal.

A second aspect relates to a system. The system includes a first filter, a second filter, a dummy load, and a switching circuit having a first terminal, a second terminal, a third terminal, a fourth terminal, and a fifth terminal, wherein the first terminal is coupled to the first filter, the second terminal is coupled to the second filter, the third terminal is coupled to a first antenna, the fourth terminal is coupled to a second antenna, and the fifth terminal is coupled to the dummy load. In a first switch configuration, the switching circuit is configured to couple the first terminal to the third terminal, and couple the second terminal to the third terminal. In a second switch configuration, the switching circuit is configured to couple the first terminal to the third terminal, couple the second terminal to the fourth terminal, and couple the fifth terminal to the third terminal. The system also includes a switch controller, wherein the switch controller is configured to receive a trigger signal, and, in response to the trigger signal, switch the switching circuit from the first switch configuration to the second switch configuration.

A third aspect relates to a system. The system includes a first bandpass filter having a first frequency band, a second bandpass filter having a second frequency band different from the first frequency band, and a third bandpass filter having a third frequency band at least partially overlapping the second frequency band. The system also includes a switching circuit coupled to the first bandpass filter, the second bandpass filter, and the third bandpass filter, and coupled to a first antenna and a second antenna. The system also includes a switch controller configured to cause the switching circuit to operably couple the first bandpass filter and the second bandpass filter to the first antenna in a first mode, and cause the switching circuit to operably couple the first bandpass filter and the third bandpass filter to the first antenna and operably couple the second bandpass filter to the second antenna in a second mode.

A fourth aspect relates to a method of operation of a system, wherein the system includes a first bandpass filter having a first frequency band, a second bandpass filter having a second frequency band different from the first frequency band, and a dummy load. The method includes, in a first mode, coupling the first bandpass filter and the second bandpass filter to a first antenna, and, in a second mode, coupling the first bandpass filter and the dummy load to the first antenna and coupling the second bandpass filter to a second antenna. The method also includes receiving a trigger signal, and switching from the first mode to the second mode in response to the trigger signal.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
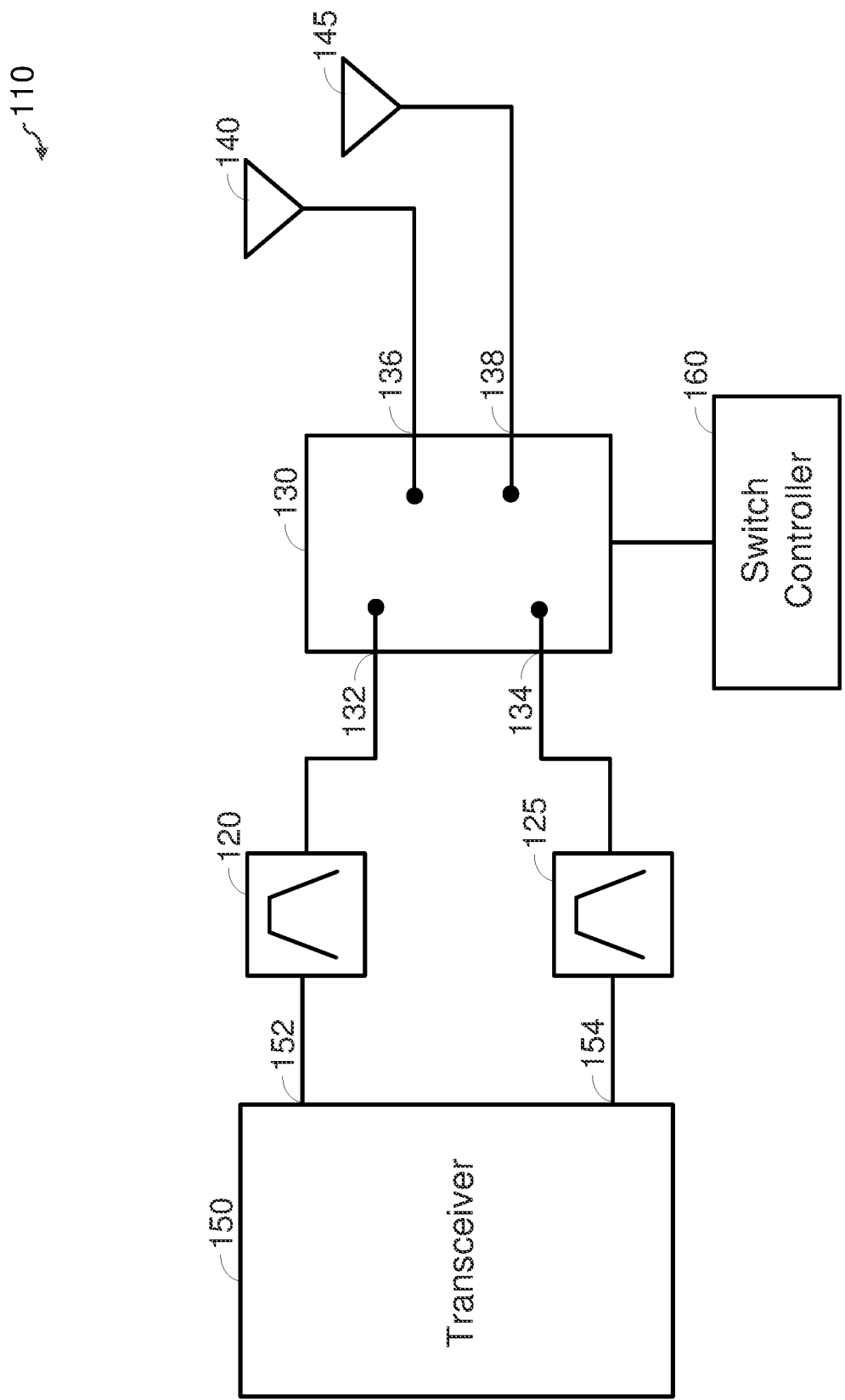
FIG. 1 shows an example of a wireless device including antennas, a switching circuit, filters, and a transceiver according to certain aspects of the present disclosure.

FIG. 1 shows an example of a wireless device 110 according to certain aspects. The wireless device 110 may be a cellular phone, a tablet computer, a laptop computer, an Internet of Things (IoT) device, an Internet of Everything (IoE) device, or the like. The wireless device 110 includes a first antenna 140, a second antenna 145, a switching circuit 130, a first filter 120, a second filter 125, a transceiver 150, and a switch controller 160.

Although two antennas 140 and 145 are shown in FIG. 1 for simplicity, it is to be appreciated that the wireless device 110 may include more than two antennas. In one example, the first antenna 140 and the second antenna 145 may point in different directions to provide coverage in different directions (e.g., the first antenna 140 and the second antenna 145 may be mounted on different sides of the wireless device 110 facing different directions). However, it is to be appreciated that the present disclosure is not limited to this example.

Each of the antennas 140 and 145 may be implemented with a patch antenna or another type of antenna. The antennas 140 and 145 may be included on the same antenna module or separate antenna modules.

The switching circuit 130 has a first terminal 132, a second terminal 134, a third terminal 136, and a fourth terminal 138. It is to be appreciated that a terminal may also be referred to as a port (e.g., input/output port) or another term. As discussed further below, the switching circuit 130 is configured to couple the terminals 132, 134, 136, and 138 in any one of multiple switch configurations under the control of the switch controller 160. In the example in FIG. 1, the third terminal 136 is coupled to the first antenna 140, and the fourth terminal 138 is coupled to the second antenna 145. In one example, the switching circuit 130 is integrated on a chip and the antennas 140 and 140 are located off the chip. In this example, each of the antennas 140 and 145 may be coupled to the respective one of the terminals 136 and 138 via a respective transmission line, which may include a respective metal trace (e.g., on a printed circuit board), a respective cable, and/or the like. It is also to be appreciated that each of the antennas 140 and 145 may or may not be coupled to the respective one of the terminals 136 and 138 via a respective transformer (not shown).

In the example in FIG. 1, the first filter 120 is coupled between a first terminal 152 of the transceiver 150 and the first terminal 132 of the switching circuit 130. In one example, the first filter 120 is a bandpass filter configured to pass RF signals in a first frequency band. The first frequency band may be within a sub-6 GHz band (e.g., any one of the LTE bands, 5G NR bands, WLAN bands (e.g., WiFi 2 or 5 GHz), and the like), a millimeter wave (mmWave) band, or the like. Herein, a "bandpass filter" is a filter configured to pass an RF signal (e.g., with less than 3 dB attenuation) within a frequency band.

The first filter 120 may include an acoustic filter, an inductor-capacitor (LC) filter, a cavity filter, a combination thereof, and/or the like. Examples of an acoustic filter include a surface acoustic wave (SAW) filter, a bulk acoustic wave (BAW) filter, and the like. The first filter 120 may also include impedance matching components (e.g., one or more inductors, one or more capacitors, a combination thereof, and/or the like) configured to provide impedance matching (e.g., between an acoustic filter or LC filter in the first filter 120 and the switching circuit 130), a phase shifter, and/or the like.

The second filter 125 is coupled between a second terminal 154 of the transceiver 150 and the second terminal 134 of the switching circuit 130. In one example, the second filter 125 is a bandpass filter configured to pass RF signals in a second frequency band. The second frequency band may be within a sub-6 GHz band (e.g., any one of the LTE bands, 5G NR bands, WLAN bands (e.g., WiFi 2 or 5 GHz), and the like), a mmWave band, or the like.

The second filter 125 may include an acoustic filter, an LC filter, a cavity filter, a combination thereof, and/or the like. Examples of an acoustic filter include a SAW filter, a BAW filter, and the like. The second filter 125 may also include impedance matching components (e.g., one or more inductors, one or more capacitors, a combination thereof, and/or the like) configured to provide impedance matching (e.g., between an acoustic filter or LC filter in the second filter 125 and the switching circuit 130), a phase shifter, and/or the like.

The first filter 120 and the second filter 125 allow the wireless device 110 to receive and/or transmit RF signals in different frequency bands (e.g., the first frequency band and the second frequency band). Although two filters 120 and 125 are shown in FIG. 1 for simplicity, it is to be appreciated that the wireless device 110 may include more than two filters (e.g., to support wireless communication in more than two frequency bands).

The first terminal 152 of the transceiver 150 may receive an RF signal in the first frequency band from one or more of the antennas 140 and 145, and/or output an RF signal in the first frequency band for wireless transmission via one or more of the antennas 140 and 145. For the example where the first terminal 152 receives an RF signal, the transceiver 150 may process the received RF signal into a baseband signal. The processing may include amplification, frequency downconversion from RF to baseband, and the like. The transceiver 150 may output the resulting baseband signal to a baseband processor (not shown), which demodulates the baseband signal to recover data and/or control information from the baseband signal. For the example where the first terminal 152 outputs an RF signal, the transceiver 150 may receive a baseband signal from the baseband processor and process the baseband signal into the RF signal. The processing may include frequency upconversion from baseband to RF, amplification, and the like.

The second terminal 154 of the transceiver 150 may receive an RF signal in the second frequency band from one or more of the antennas 140 and 145, and/or output an RF signal in the second frequency band for wireless transmission via one or more of the antennas 140 and 145. For the example where the second terminal 154 receives an RF signal, the transceiver 150 may process the received RF signal into a baseband signal. The processing may include amplification, frequency downconversion from RF to baseband, and the like. The transceiver 150 may output the resulting baseband signal to the baseband processor, which demodulates the baseband signal to recover data and/or control information from the baseband signal. For the example where the second terminal 154 outputs an RF signal, the transceiver 150 may receive a baseband signal from the baseband processor and process the baseband signal into the RF signal. The processing may include frequency upconversion from baseband to RF, amplification, and the like.

Figure 2:
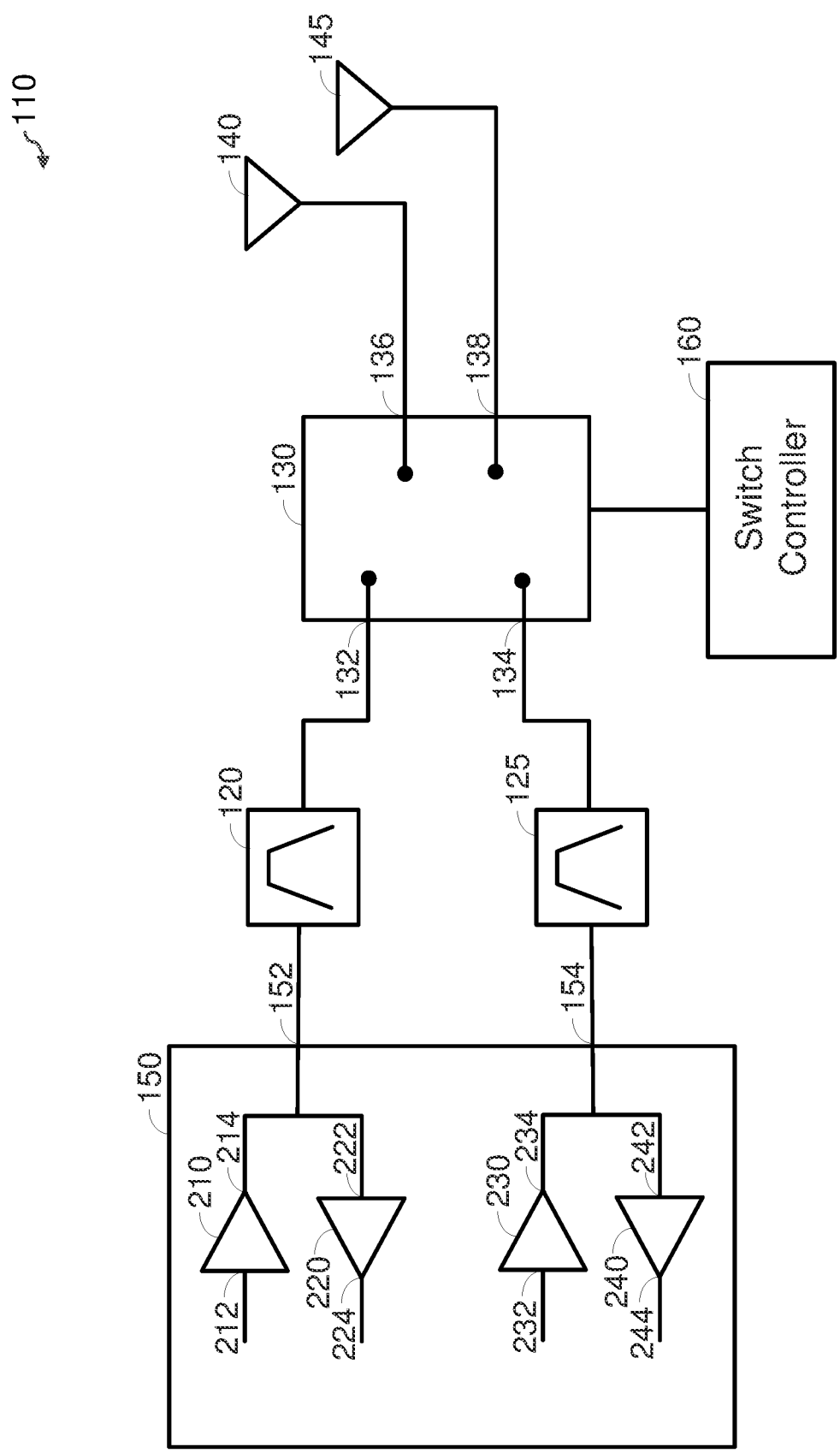
FIG. 2 shows an example in which the transceiver includes power amplifiers and low-noise amplifiers according to certain aspects of the present disclosure.

FIG. 2 shows an example in which the transceiver 150 includes a first power amplifier 210 and a first low-noise amplifier (LNA) 220. In this example, the output 214 of the first power amplifier 210 is coupled to the first terminal 152, and the input 222 of the first LNA 220 is coupled to the first terminal 152. The first power amplifier 210 is configured to receive an RF signal at the input 212, amplify the RF signal, and output the amplified RF signal at the output 214 (which is coupled to the first terminal 152) for wireless transmission via one or more of the antennas 140 and 145. The first LNA 220 is configured to receive an RF signal at the input 222 via the first terminal 152, amplify the received RF signal, and output the amplified RF signal at the output 224 (e.g., to a mixer or another component in the transceiver 150). It is to be appreciated that one of the first power amplifier 210 and the first LNA 220 may be omitted in some implementations. For example, for an implementation in which the first terminal 152 only receives an RF signal, the first power amplifier 210 may be omitted.

In the example in FIG. 2, the transceiver 150 also includes a second power amplifier 230 and a second LNA 240. In this example, the output 234 of the second power amplifier 230 is coupled to the second terminal 154, and the input 242 of the second LNA 240 is coupled to the second terminal 154. The second power amplifier 230 is configured to receive an RF signal at the input 232, amplify the RF signal, and output the amplified RF signal at the output 234 (which is coupled to the second terminal 154) for wireless transmission via one or more of the antennas 140 and 145. The second LNA 240 is configured to receive an RF signal at the input 242 via the second terminal 154, amplify the received RF signal, and output the amplified RF signal at the output 244 (e.g., to a mixer or another component in the transceiver 150). It is to be appreciated that one of the second power amplifier 230 and the second LNA 240 may be omitted in some implementations. It is also to be appreciated that the transceiver 150 is not limited to the example shown in FIG. 2.

In certain aspects, the wireless device 110 may transmit and receive RF signals using time divisional duplexing (TDD) and/or frequency division duplexing (FDD). For TDD, the wireless device 110 transmits and receives RF signals in separate time slots. For FDD, the wireless device 110 transmits and receives RF signals on different frequencies (e.g., different frequencies within a frequency band). It is to be appreciated that the wireless device 110 may support both TDD and FDD. For example, the wireless device 110 may support multiple frequency bands in which one or more of the frequency bands are used for TDD, and one or more other ones of the frequency bands are used for FDD.

As discussed above, the switching circuit 130 is configured to couple the terminals 132, 134, 136, and 138 in any one of multiple switch configurations under the control of the switch controller 160. The switching circuit 130 may be implemented with multiple switches, in which each of the switches is coupled between two of the terminals 132, 134, 136, and 138, and the on/off state of each of the switches is controlled by the switch controller 160.

Figure 3A:
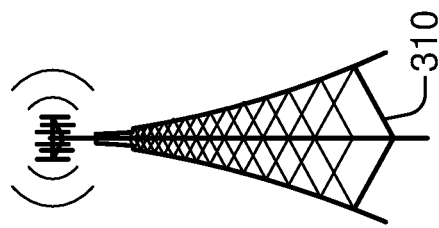
FIG. 3A shows an example of the switching circuit in a first switch configuration according to certain aspects of the present disclosure.
Figure 3A:
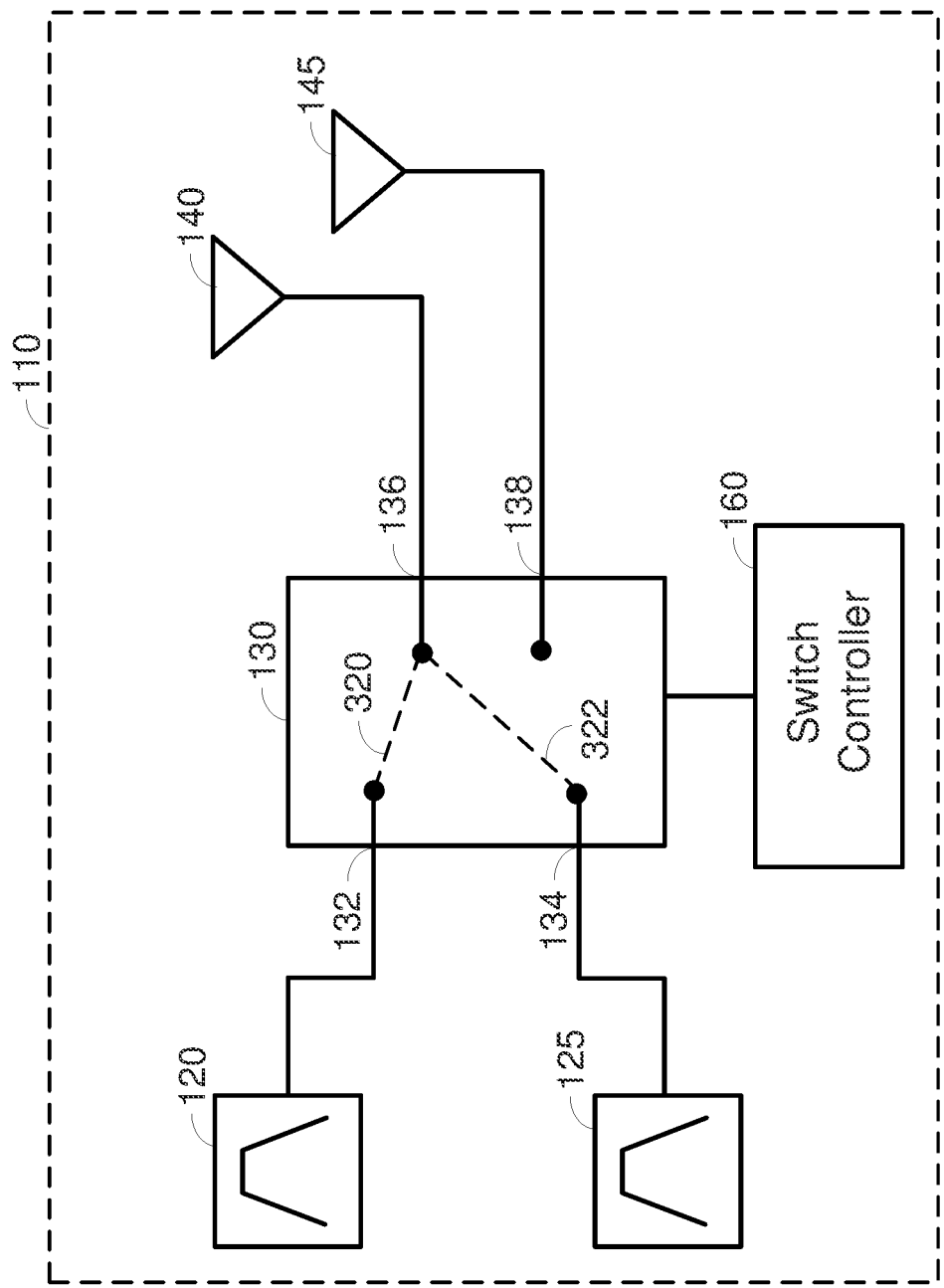
Figure 3B:
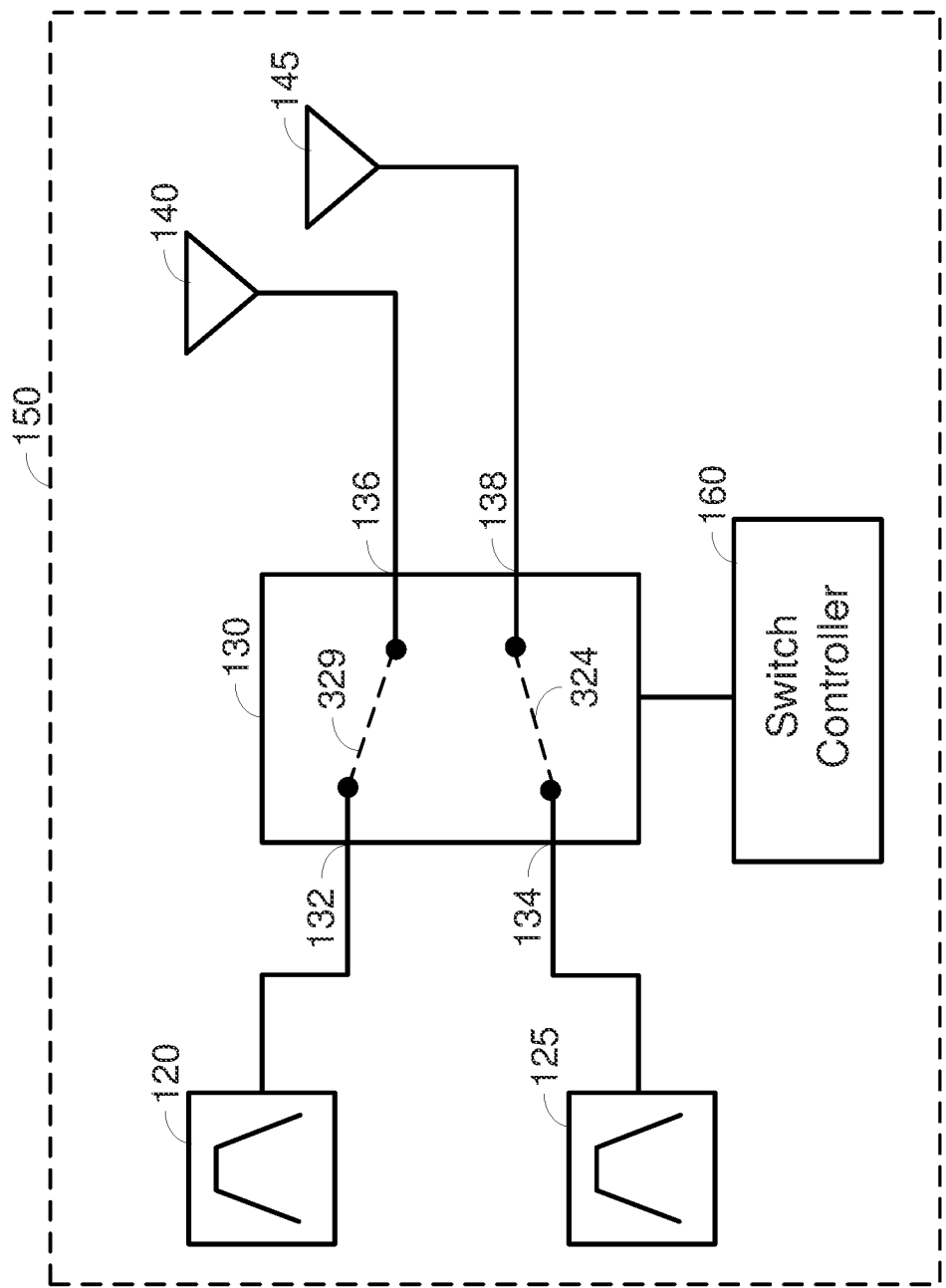
FIG. 3B shows an example of the switching circuit in a second switch configuration according to certain aspects of the present disclosure.

FIGS. 3A and 3B show an example in which the switch controller 160 switches the switching circuit 130 from a first switch configuration to a second switch configuration. FIG. 3A illustrates the first switch configuration and FIG. 3B illustrates the second switch configuration. As discussed further below, the switching from the first switch configuration to the second switch configuration causes a disturbance in the RF signal passing through the first filter 120. The first switch configuration may also be referred to as a first mode and the second switch configuration may also be referred to as a second mode.

In the first switch configuration illustrated in FIG. 3A, the switching circuit 130 couples the first terminal 132 to the third terminal 136, and couples the second terminal 134 to the third terminal 136. The coupling between the first terminal 132 and the third terminal 136 is represented by dashed line 320, and the coupling between the second terminal 134 and the third terminal 136 is represented by dashed line 322. Thus, in the first switch configuration, the switching circuit 130 couples the first filter 120 and the second filter 125 to the first antenna 140.

In this example, the transceiver 150 (shown in FIG. 1) may receive a first RF signal from the first antenna 140 in the first frequency band via the switching circuit 130 and the first filter 120. The transceiver 150 may receive the first RF signal via the first terminal 152, and convert the first RF signal into a baseband signal. The baseband processor (not shown) may then demodulate the baseband signal to recover data and/or control information from the baseband signal.

The transceiver 150 may also output, at the second terminal 154, a second RF signal in the second frequency band for wireless transmission via the first antenna 140. The first antenna 140 receives the second RF signal via the second filter 125 and the switching circuit 130. In one example, the second RF signal includes a sounding reference signal (SRS) during some time period. It is to be appreciated that the second RF signal may also include one or more other signals in addition to the SRS. In this example, the first antenna 140 transmits the second RF signal to a base station 310, which receives the SRS in the second RF signal and uses the SRS to estimate the channel quality between the first antenna 140 and the base station 310. As used herein, a "sounding reference signal" is a reference signal used by a base station (e.g., eNodeB, gNB, etc.) or an access point to estimate channel quality.

In the second switch configuration illustrated in FIG. 3B, the switching circuit 130 couples the first terminal 132 to the third terminal 136, and couples the second terminal 134 to the fourth terminal 138. The coupling between the second terminal 134 and the fourth terminal 138 is represented by dashed line 324. Thus, in the second switch configuration, the switching circuit 130 keeps the first terminal 132 coupled to the first antenna 140 while switching the second terminal 134 from the first antenna 140 to the second antenna 145.

In the second switch configuration, the transceiver 150 (shown in FIG. 1) may continue to receive the first RF signal from the first antenna 140 via the first terminal 152 of the transceiver 150. The transceiver 150 may also output, at the second terminal 154, the second RF signal including the SRS for transmission via the second antenna 145. In this example, the second antenna 145 receives the second RF signal via the second filter 125 and the switching circuit 130, and transmits the second RF signal to the base station 310. The base station 310 receives the SRS in the second RF signal and uses the SRS to estimate the channel quality between the second antenna 145 and the base station 310.

Thus, in this example, the wireless device 110 switches transmission of the second RF signal (which may include the SRS) from the first antenna 140 in FIG. 3A to the second antenna 145 in FIG. 3B while continuing to receive the first RF signal via the first antenna 140. The switching of the SRS from the first antenna 140 to the second antenna 145 allows the base station 310 to estimate the channel quality between the first antenna 140 and the base station 310, and the channel quality between the second antenna 145 and the base station 310. The base station 310 may use this channel information, for example, to determine which one of the first antenna 140 and the second antenna 145 to use for a communication link between the wireless device 110 and the base station 310. For example, the base station 310 may select the antenna having the highest estimated channel quality for the link.

Thus, in the above example, the switching circuit 130 switches from the first switch configuration illustrated in FIG. 3A to the second switch configuration illustrated in FIG. 3B. This may be done, for example, to switch transmission of the SRS from the first antenna 140 to the second antenna 145 while continuing to receive the first RF signal via the first antenna 140. However, a challenge with switching from the first switch configuration to the second switch configuration is that the switching may cause a disturbance in the first RF signal, which degrades the throughput of the first RF signal, as discussed further below.

As shown in FIG. 3A, in the first switch configuration, the switching circuit 130 couples both the first filter 120 and the second filter 125 to the first antenna 140. Ideally, the second filter 125 acts as a perfect open circuit (or at least a substantially high impedance) for an out-of-bound frequency range (i.e., a frequency range outside of the second frequency band) so that the second filter 125 does not affect the performance of a filter having a frequency band outside of the second frequency band. In this example, the first frequency band of the first filter 120 does not overlap the second frequency band and is therefore in an out-of-bound frequency range with respect to the second filter 125. Thus, in this example, it is desirable for the second filter 125 to act as an open circuit (or at least a substantially high impedance) in the first frequency band.

However, in practice, the second filter 125 does not act as a perfect open circuit in the first frequency band, and therefore provides some impedance loading on the first filter 120, which affects the performance (e.g., frequency response) of the first filter 120. The transceiver 150 may be configured to adjust to the additional impedance loading on the first filter 120 (e.g., through tuning or calibration of one or more components in the transceiver 150) to operate efficiently with the additional impedance loading.

The impedance loading on the first filter 120 from the second filter 125 is removed when the switching circuit 130 switches the second filter 125 to the second antenna 145 in the second switch configuration in FIG. 3B. The removal of the impedance loading on the first filter 120 causes an abrupt change in the performance (e.g., frequency response) of the first filter 120.

Figure 4A:
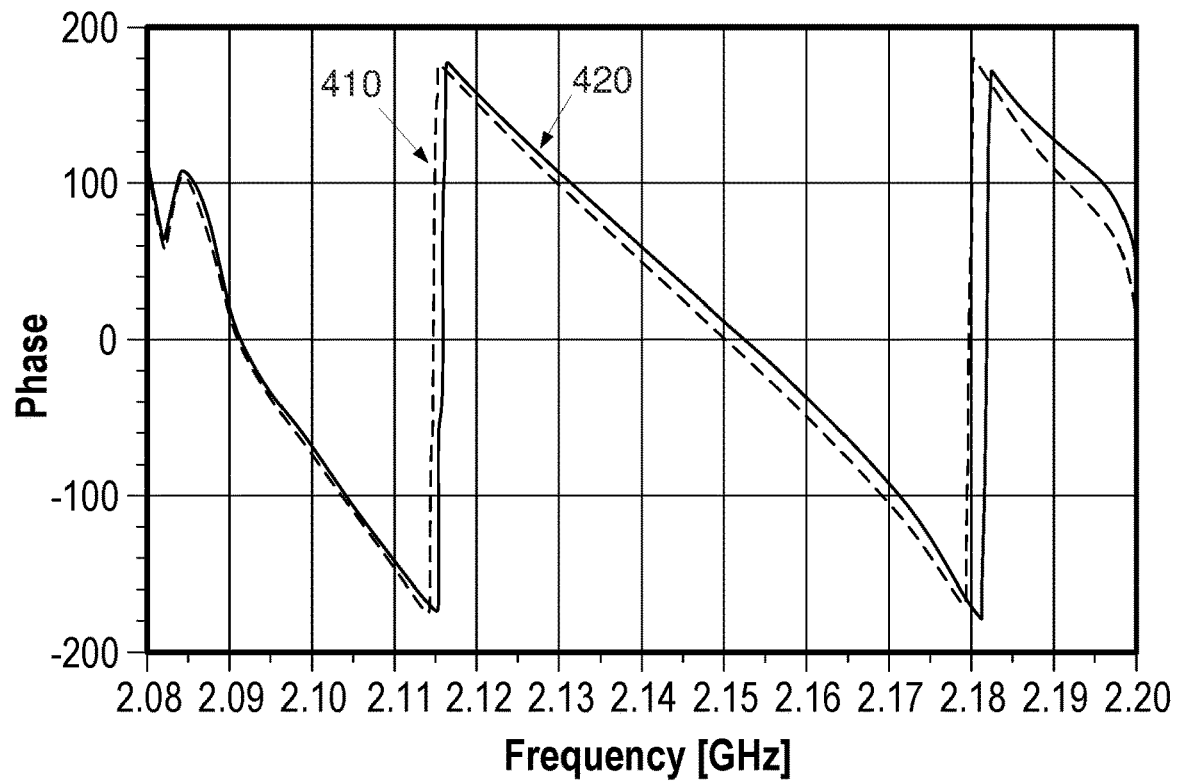
FIG. 4A shows an example of a phase shift due to a loading change caused by switching according to certain aspects of the present disclosure.
Figure 4B:
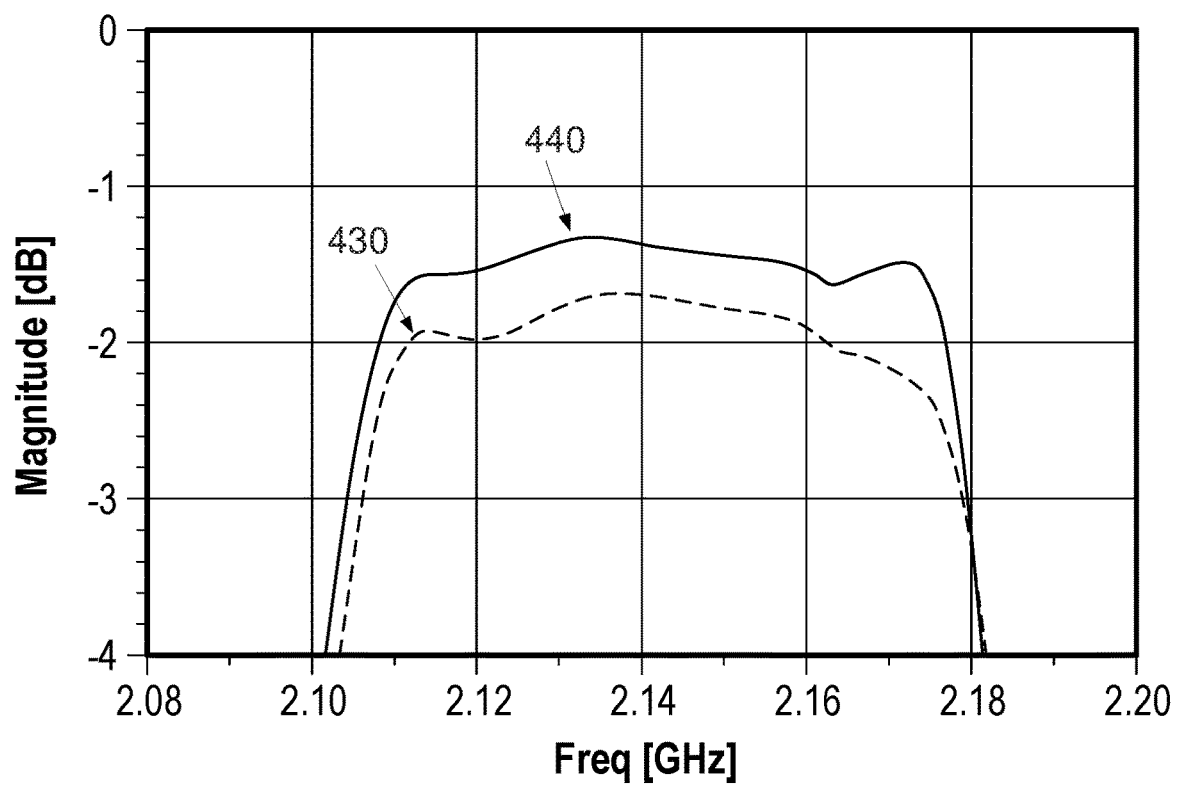
FIG. 4B shows an example of an amplitude shift due to a loading change caused by switching according to certain aspects of the present disclosure.

An example of the abrupt change in the performance of the first filter 120 due to the loading change on the first filter 120 is illustrated in FIGS. 4A and 4B. FIG. 4A shows a phase 410 of the first RF signal versus frequency after the first RF signal has passed through the first filter 120 in the first switch configuration, and a phase 420 of the first RF signal versus frequency after the first RF signal has passed through the first filter 120 in the second switch configuration. As shown in FIG. 4A, switching from the first switch configuration to the second switch configuration causes an abrupt phase shift in the first RF signal. FIG. 4B shows an amplitude 430 of the first RF signal versus frequency after the first RF signal has passed through the first filter 120 in the first switch configuration, and an amplitude 440 of the first RF signal versus frequency after the first RF signal has passed through the first filter 120 in the second switch configuration. As shown in FIG. 4B, switching from the first switch configuration to the second switch configuration causes an amplitude shift in the first RF signal. Thus, switching from the first switch configuration to the second switch configuration causes an abrupt phase shift and an abrupt amplitude shift in the first RF signal due to the change in the impedance loading on the first filter 120.

The abrupt phase shift and abrupt amplitude shift in the first RF signal caused by the loading change due to switching may degrade the throughput of the first RF signal. For example, after the first RF signal is converted into a baseband signal by the transceiver 150, the abrupt phase shift and/or abrupt amplitude shift may cause demodulation errors in the baseband processor, which degrades throughput. Accordingly, it is desirable to mitigate the change in the impedance loading of a filter caused by switching to reduce degradation in the throughput of the RF signal passing through the filter.

Figure 5A:
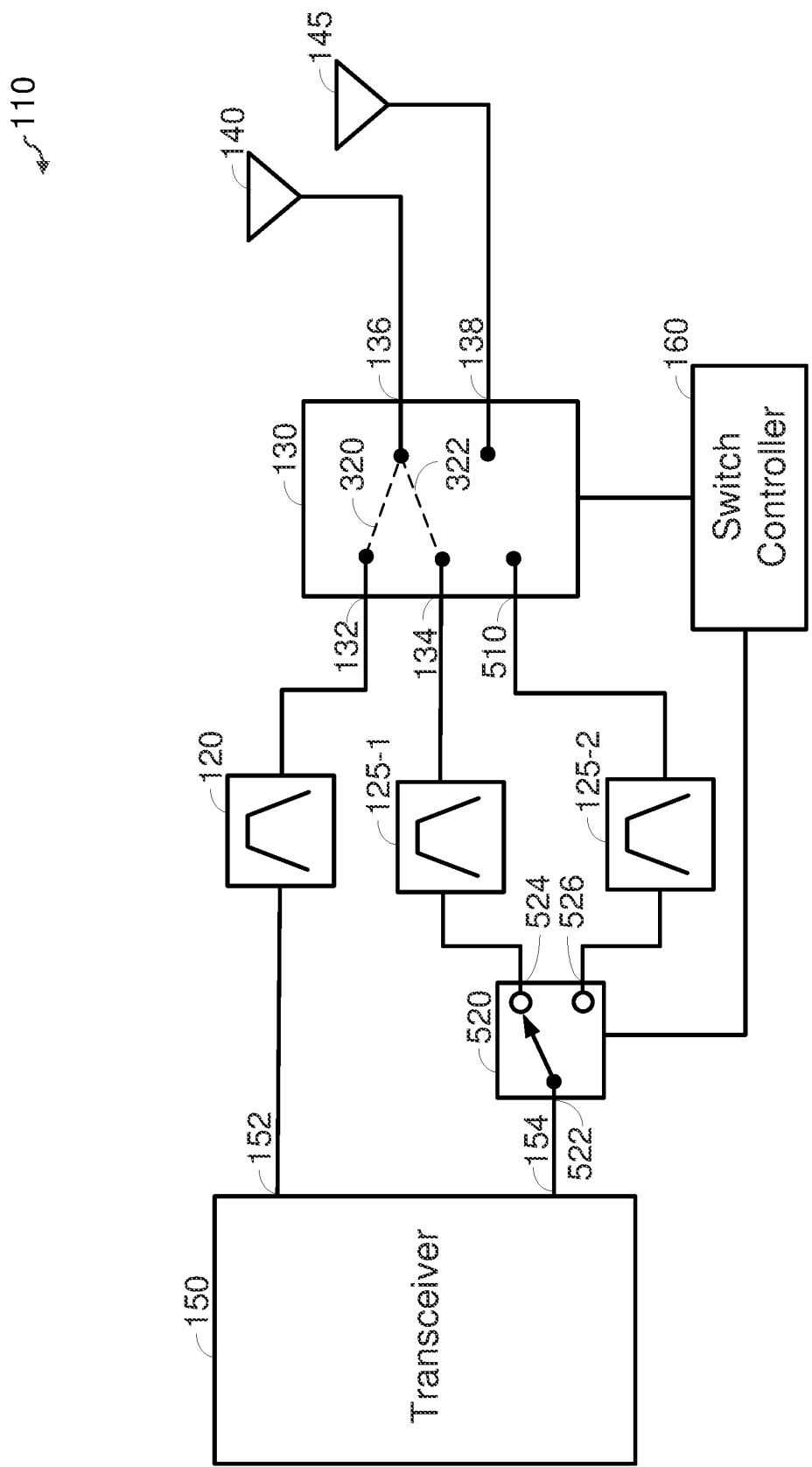
FIG. 5A shows an example in which the transceiver includes a switch in a first configuration and two instances of a filter to mitigate loading change due to switching according to certain aspects of the present disclosure.
Figure 5B:
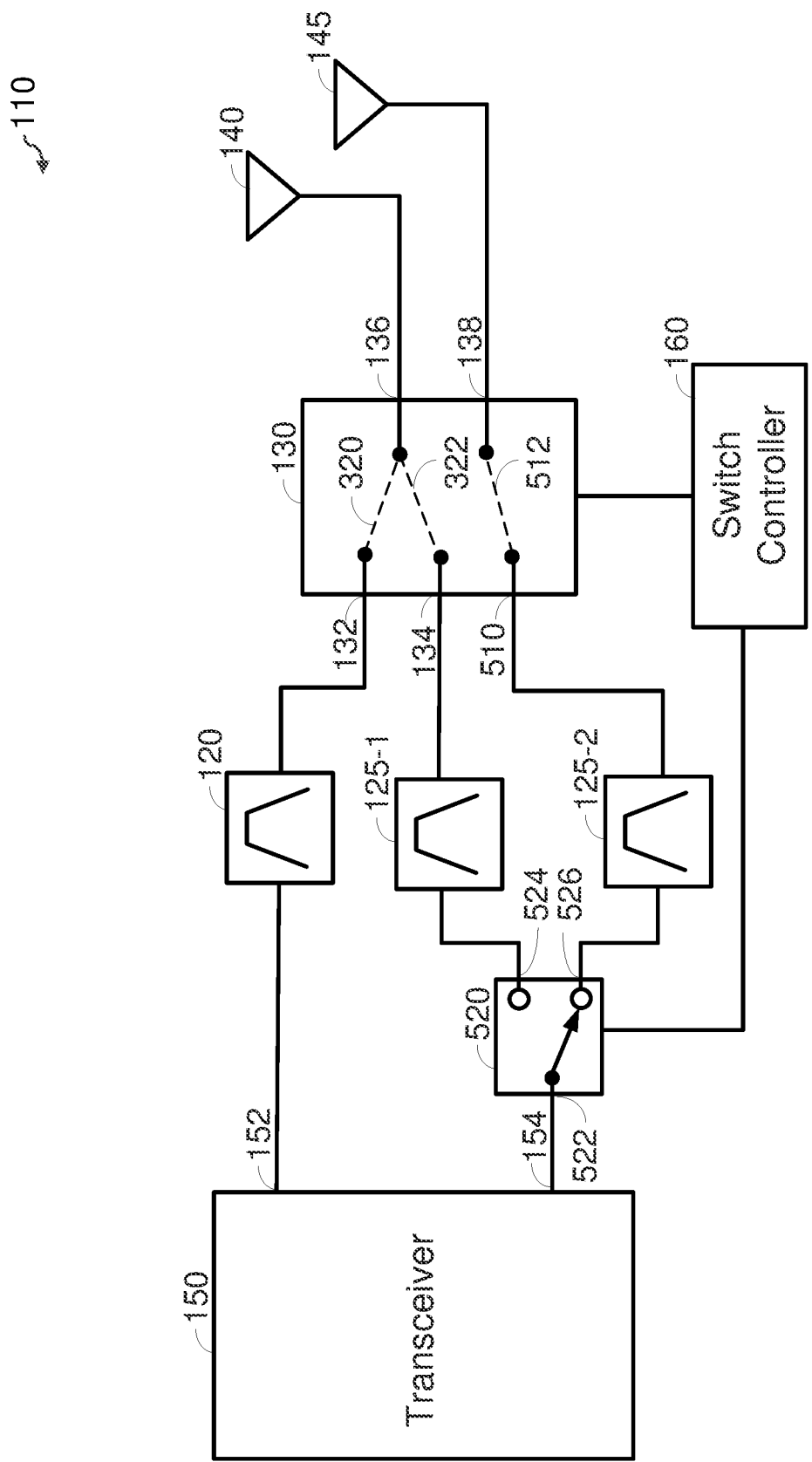
FIG. 5B shows an example of the switch in FIG. 5B in a second configuration according to certain aspects of the present disclosure.

FIGS. 5A and 5B show an example in which the wireless device 110 includes two instances of the second filter 125 to mitigate loading change due to switching according to certain aspects. In FIGS. 5A and 5B, the first instance of the second filter 125 is indicated by the reference number 125-1 and the second instance of the second filter 125 is indicated by the reference number 125-2.

In this example, the wireless device 110 further includes an RF switch 520. The RF switch 520 has a first terminal 522, a second terminal 524, and a third terminal 526. The first terminal 522 is coupled to the second terminal 154 of the transceiver 150. The first instance of the second filter 125-1 is coupled between the second terminal 524 of the RF switch 520 and the second terminal 134 of the switching circuit 130. The second instance of the second filter 125-2 is coupled between the third terminal 526 of the RF switch 520 and a fifth terminal 510 of the switching circuit 130. In this example, the RF switch 520 is configured to couple the first terminal 522 to the second terminal 524 or the third terminal 526 under the control of the switch controller 160.

FIG. 5A shows the switching circuit 130 in a switch configuration in which the switching circuit 130 couples both the first terminal 132 and the second terminal 134 to the third terminal 136, which is coupled to the first antenna 140. Also, in the example shown in FIG. 5A, the RF switch 520 couples the first terminal 522 to the second terminal 524. As a result, the RF switch 520 couples the second terminal 154 of the transceiver 150 to the first instance of the second filter 125-1.

In the example in FIG. 5A, the transceiver 150 may receive the first RF signal from the first antenna 140 in the first frequency band via the switching circuit 130 and the first filter 120. The transceiver 150 may receive the first RF signal via the first terminal 152, and convert the first RF signal into a baseband signal for processing by the baseband processor (not shown). In this example, the first instance of the second filter 125-1 loads the first filter 120 through the switching circuit 130.

The transceiver 150 may also output, at the second terminal 154, the second RF signal in the second frequency band for wireless transmission via the first antenna 140. In this example, the RF switch 520 causes the second RF signal to pass through the first instance of the second filter 125-1 to the second terminal 134 of the switching circuit 130, which is coupled to the first antenna 140. As discussed above, the second RF signal may include the SRS, which allows the base station 310 (shown in FIGS. 3A and 3B) receiving the second RF signal to estimate the channel quality between the first antenna 140 and the base station 310.

In FIG. 5B, the switching circuit 130 keeps the first instance of the second filter 125-1 coupled to the first antenna 140. As a result, the first instance of the second filter 125-1 continues to load the first filter 120 through the switching circuit 130. Thus, the load condition on the first filter 120 does not change between FIG. 5A and FIG. 5B.

In FIG. 5B, the switching circuit 130 couples the fifth terminal 510 to the fourth terminal 138, which is coupled to the second antenna 145. The coupling between the fifth terminal 510 and the fourth terminal 138 is represented by the dashed line 512. Also, in FIG. 5B, the RF switch 520 couples the first terminal 522 to the third terminal 526 instead of the second terminal 524. Thus, the RF switch 520 switches the second terminal 154 of the transceiver 150 from the first instance of the second filter 125-1 to the second instance of the second filter 125-2.

In the example in FIG. 5B, the transceiver 150 may continue to receive the first RF signal from the first antenna 140 in the first frequency band via the switching circuit 130 and the first filter 120. Because the load condition on the first filter 120 does not change between FIG. 5A and FIG. 5B, the first RF signal is not disturbed by an abrupt change in the performance of the first filter 120 due to a loading change.

The transceiver 150 may also output, at the second terminal 154, the second RF signal in the second frequency band for wireless transmission via the second antenna 145. In this example, the RF switch 520 causes the second RF signal to pass through the second instance of the second filter 125-2 to the fifth terminal 510 of the switching circuit 130, which is coupled to the second antenna 145. As discussed above, the second RF signal may include the SRS, which allows the base station 310 (shown in FIGS. 3A and 3B) receiving the second RF signal to estimate the channel quality between the second antenna 145 and the base station 310.

Thus, in this example, transmission of the SRS switches from the first antenna 140 in FIG. 5A to the second antenna 145 in FIG. 5B. The SRS switching does not cause a loading change on the first filter 120. This is because the first instance of the second filter 125-1 loads the first filter 120 through the switching circuit 130 in FIG. 5A and FIG. 5B. Because the load condition on the first filter 120 does not change between FIGS. 5A and 5B, the first RF signal is not disturbed by an abrupt change in the performance of the first filter 120 due to a loading change. Thus, the second instance of the second filter 125-2 allows the wireless device 110 to switch transmission of the SRS from the first antenna 140 to the second antenna 145 without disturbing the first RF signal passing through the first filter 120 due to loading change. The addition of the second instance of the second filter 125-2 and the RF switch 520 may increase the area and cost of the wireless device 110.

Figure 6:
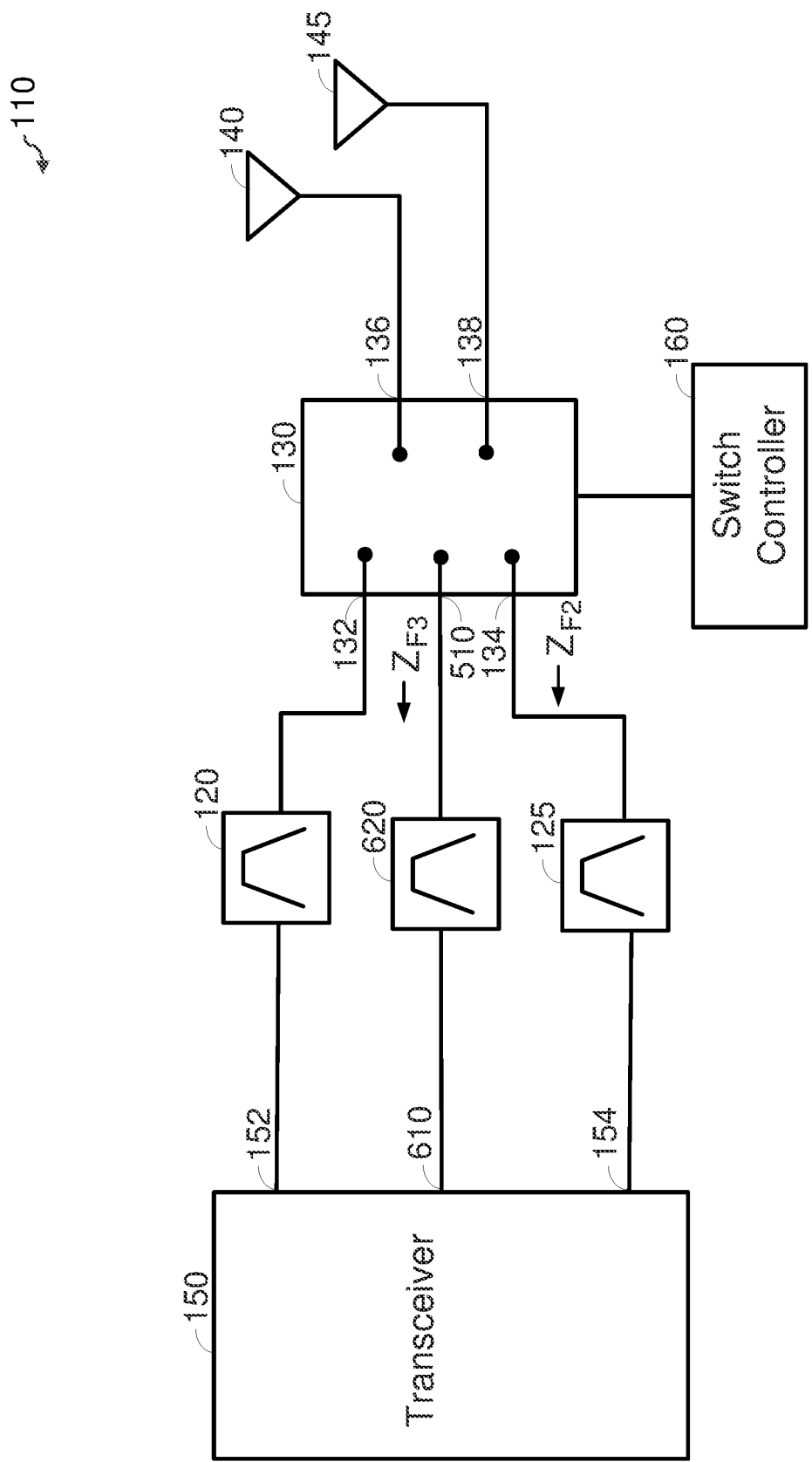
FIG. 6 shows an example in which the wireless device includes a third filter that may be used to mitigate loading change due to switching according to certain aspects of the present disclosure.

As discussed above, the wireless device 110 may include more than two filters (e.g., to support more than two frequency bands). In this regard, FIG. 6 shows an example in which the wireless device 110 also includes a third filter 620 in addition to the first filter 120 and the second filter 125 discussed above. As discussed further below, the third filter 620 may be used as a dummy load to reduce loading change due to switching.

The third filter 620 is coupled between a third terminal 610 of the transceiver 150 and the fifth terminal 510 of the switching circuit 130. Note that FIG. 6 shows the fifth terminal 510 between the first terminal 132 and the second terminal 134 for ease of illustration. However, it is to be appreciated that the fifth terminal 510 may be placed at various locations on the switching circuit 130, and is therefore not limited to a particular location on the switching circuit 130. In one example, the third filter 620 is a bandpass filter configured to pass RF signals in a third frequency band. The third frequency band may be within a sub-6 GHz band, a mmWave band, or the like. The third frequency band may or may not overlap the second frequency band, as discussed further below.

The third filter 620 may include an acoustic filter, an LC filter, a cavity filter, a combination thereof, and/or the like. Examples of an acoustic filter include a SAW filter, a BAW filter, and the like. The third filter 620 may also include impedance matching components (e.g., one or more inductors, one or more capacitors, a combination thereof, and/or the like) configured to provide impedance matching (e.g., between an acoustic filter or LC filter in the third filter 620 and the switching circuit 130), a phase shifter, and/or the like.

The third terminal 610 of the transceiver 150 may receive an RF signal in the third frequency band from one or more of the antennas 140 and 145, and/or output an RF signal in the third frequency band for wireless transmission via one or more of the antennas 140 and 145. For the example where the third terminal 610 receives an RF signal, the transceiver 150 may process the received RF signal into a baseband signal. The processing may include amplification, frequency downconversion from RF to baseband, and the like. The transceiver 150 may output the resulting baseband signal to the baseband processor (not shown) for further processing (e.g., demodulation). For the example where the third terminal 610 outputs an RF signal, the transceiver 150 may receive a baseband signal from the baseband processor and process the baseband signal into the RF signal. The processing may include frequency upconversion from baseband to RF, amplification, and the like.

To transmit an RF signal in the third frequency band via the first antenna 140 and/or receive an RF signal in the third frequency band from the first antenna 140, the switch controller 160 places the switching circuit 130 in a switch configuration that couples the fifth terminal 510 to the third terminal 136. This configuration couples the third terminal 610 of the transceiver 150 to the first antenna 140 through the third filter 620 and the switching circuit 130. To transmit an RF signal in the third frequency band via the second antenna 145 and/or receive an RF signal in the third frequency band from the second antenna 145, the switch controller 160 places the switching circuit 130 in a switch configuration that couples the fifth terminal 510 to the fourth terminal 138. This configuration couples the third terminal 610 of the transceiver 150 to the second antenna 145 through the third filter 620 and the switching circuit 130. It is to be appreciated that an RF signal in the third frequency band may also be referred to as a third RF signal.

Figure 7A:
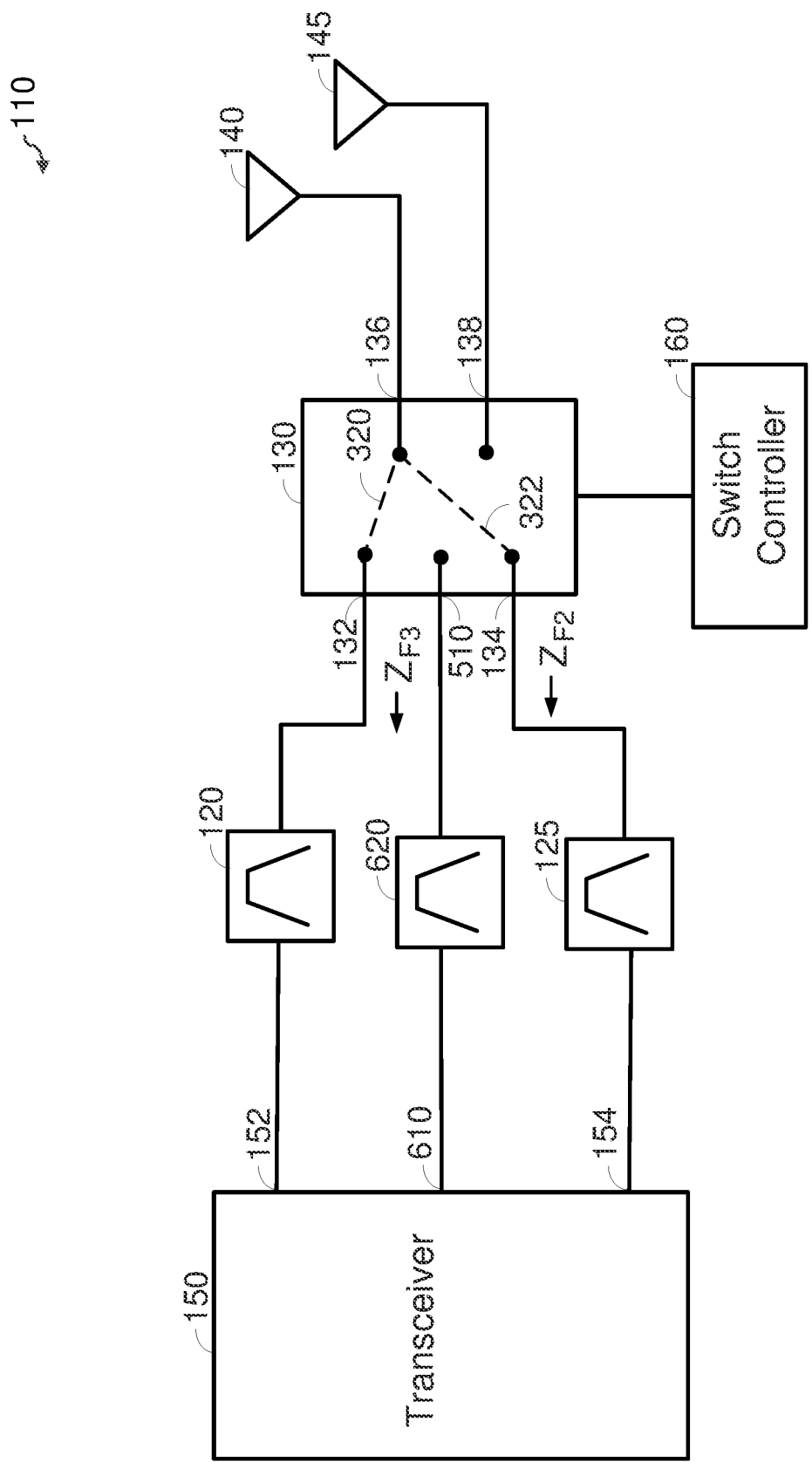
FIG. 7A shows an example of a switching circuit in the wireless device of FIG. 6 in a first switch configuration according to certain aspects of the present disclosure.
Figure 7B:
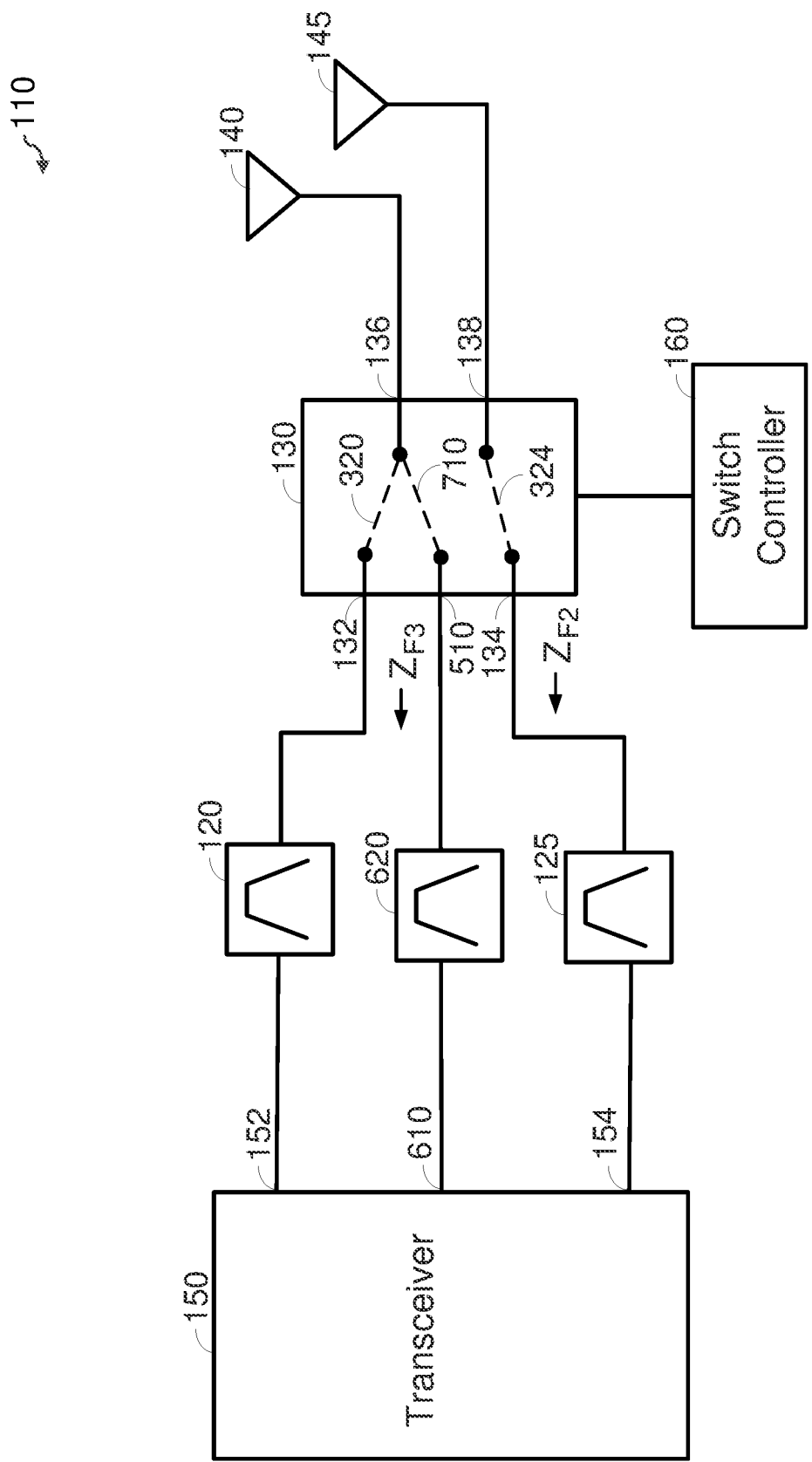
FIG. 7B shows an example of the switching circuit in the wireless device of FIG. 6 in a second switch configuration according to certain aspects of the present disclosure.

FIGS. 7A and 7B show an example in which the switch controller 160 switches the switching circuit 130 from a first switch configuration to a second switch configuration. FIG. 7A illustrates the first switch configuration and FIG. 7B illustrates the second switch configuration. As discussed further below, the third filter 620 is used as a dummy load in the second switch configuration to mitigate loading change between the first switch configuration and the second switch configuration.

In the first switch configuration illustrated in FIG. 7A, the switching circuit 130 couples the first terminal 132 to the third terminal 136, and couples the second terminal 134 to the third terminal 136. Thus, in the first switch configuration, the switching circuit 130 couples the first filter 120 and the second filter 125 to the first antenna 140. In the first switch configuration, the second filter 125 loads the first filter 120 through the switching circuit 130. The third filter 620 is decoupled from the first antenna 140 in the first switch configuration.

In this example, the transceiver 150 may receive the first RF signal from the first antenna 140 in the first frequency band via the switching circuit 130 and the first filter 120. The transceiver 150 may receive the first RF signal via the first terminal 152, and convert the first RF signal into a baseband signal. The baseband processor (not shown) may then demodulate the baseband signal to recover data and/or control information from the baseband signal.

The transceiver 150 may also output, at the second terminal 154, the second RF signal in the second frequency band for wireless transmission via the first antenna 140. The first antenna 140 receives the second RF signal via the second filter 125 and the switching circuit 130. The second RF signal may include the SRS, which allows the base station 310 receiving the SRS in the second RF to estimate the channel quality between the first antenna 140 and the base station 310.

In the second switch configuration illustrated in FIG. 7B, the switching circuit 130 couples the first terminal 132 to the third terminal 136, and couples the second terminal 134 to the fourth terminal 138. Thus, in the second switch configuration, the switching circuit 130 keeps the first terminal 132 coupled to the first antenna 140 while switching the second terminal 134 from the first antenna 140 to the second antenna 145. Also, in the second switch configuration, the switching circuit 130 couples the fifth terminal 510 to the third terminal 136. The coupling between the fifth terminal 510 and the third terminal 136 is represented by the dashed line 710. In the second switch configuration, the third filter 620 loads the first filter 120 through the switching circuit 130. As discussed further below, the loading by the third filter 620 in the second switch configuration mitigates the loading change on the first filter 120 due to switching from the first switch configuration to the second switch configuration. The second filter 125 is decoupled from the first antenna 140 in the second switch configuration.

In the second switch configuration, the transceiver 150 may continue to receive the first RF signal from the first antenna 140 via the first terminal 152 of the transceiver 150. The transceiver 150 may also output the second RF signal including the SRS at the second terminal 154 for transmission via the second antenna 145. In this example, the second antenna 145 receives the second RF signal via the second filter 125 and the switching circuit 130, and transmits the second RF signal to the base station 310. The base station 310 receives the second RF signal and uses the SRS in the second RF signal to estimate the channel quality between the second antenna 145 and the base station 310.

Thus, in this example, the wireless device 110 switches transmission of the second RF signal (which may include the SRS) from the first antenna 140 in FIG. 7A to the second antenna 145 in FIG. 7B while continuing to receive the first RF signal via the first antenna 140. The switching of the SRS from the first antenna 140 to the second antenna 145 allows the base station 310 to estimate the channel quality between the first antenna 140 and the base station 310, and the channel quality between the second antenna 145 and the base station 310.

Also, in this example, the first filter 120 is loaded by the second filter 125 in the first switch configuration, and loaded by the third filter 620 in the second switch configuration. Assuming the second filter 125 and the third filter 620 provide similar impedance loading on the first filter 120 in the first frequency band, the loading change between the first switch configuration and the second switch configuration is significantly reduced compared with the example illustrated in FIGS. 3A and 3B. The reduced loading change significantly reduces the disturbance in the first RF signal caused by the loading change, and therefore reduces or eliminates the degradation in the throughput of the first RF signal.

To provide similar impedance loading on the first filter 120, the impedance of the second filter 125 may be similar to the impedance of the third filter 620 in the first frequency band, as discussed further below. The impedance of the second filter 125 may be the impedance (labeled "$Z_{F2}$") looking into the second filter 125 from the second terminal 134 in the first frequency band. The impedance of the third filter 620 may be the impedance (labeled "$Z_{F3}$") looking into the third filter 620 from the fifth terminal 510 in the first frequency band.

In certain aspects, the third filter 620 is not used for transmission or reception in the second switch configuration. In other words, the wireless device 110 does not transmit or receive the third RF signal in third frequency band in the second switch configuration. Rather, the impedance of the third filter 620 is used as a dummy load to load the first filter 120 in the second switch configuration to reduce the loading change between the first switch configuration and the second switch configuration. An advantage of using the third filter 620 as the dummy load in the second switch configuration is that the third filter 620 may already be present in the wireless device 110 to receive and/or transmit the third RF signal in another switch configuration. Thus, using the third filter 620 as the dummy load does not require adding another instance of the second filter 125, which adds costs and area.

As discussed above, the third filter 620 may have a similar impedance as the second filter 125 in the first frequency band to reduce loading change on the first filter 120 when switching from the first switch configuration to the second switch configuration. This may be accomplished, for example, by implementing each of the third filter 620 and the second filter 125 with the same type of filter. Because each of the third filter 620 and the second filter 125 is implemented with the same type of filter, the third filter 620 and the second filter 125 have similar structures which may help provide the third filter 620 and the second filter 125 with similar impedances. For example, each of the filters 125 and 620 may be implemented with a BAW, each of the filters 125 and 620 may be implemented with a SAW, each of the filters 125 and 620 may be implemented with an LC filter, and the like.

In certain aspects, the second frequency band and the third frequency band overlap, which may help provide the third filter 620 and the second filter 125 with similar impedances in the first frequency band. For the example where each of the filters 125 and 620 is implemented with an LC filter, the overlapping frequency bands may correspond to similar inductances and capacitances for the LC filters, which may translate into similar impedances in the first frequency band. For the example where each of the filters 125 and 620 is implemented with an acoustic filter, the overlapping frequency bands may correspond to similar designs, similar stacked layers, similar layer thicknesses, and the like, which may translate into similar impedances in the first frequency band.

In certain aspects, the second frequency band may include at least a portion of one or more LTE frequency bands (e.g., any one or more of the LTE frequency bands B1 to B72), at least a portion of one or more NR frequency bands, and the like. The third frequency band may include at least a portion of one or more LTE frequency bands (e.g., any one or more of the LTE frequency bands B1 to B72), at least a portion of one or more NR frequency bands, and the like. In one example, the second frequency band may include at least a portion of the band B41 (e.g., 2496-2690 MHz) and the third frequency band may include at least a portion of the band B7 (e.g., 2500-2570 MHz for uplink and 2620-2690 MHz for downlink). In this example, the second frequency band and the third frequency band overlap, which helps provide the second filter 125 and the third filter 620 with similar impedances in the first frequency band. It is to be appreciated that the second frequency band and the third frequency band are not limited to this example.

Thus, the second filter 125 and the third filter 620 may have similar impedance in the first frequency band to reduce the loading change on the first filter 120 when switching from the first switch configuration to the second switch configuration. As discussed above, the impedance of the second filter 125 may be the impedance (labeled "$Z_{F2}$") looking into the second filter 125 from the second terminal 134 in the first frequency band, and the impedance of the third filter 620 may be the impedance (labeled "$Z_{F3}$") looking into the third filter 620 from the fifth terminal 510 in the first frequency band.

In certain aspects, the impedance of the second filter 125 may be defined to be similar to the impedance of the third filter 620 when the absolute impedance phase difference (i.e., delta) between the second filter 125 and the third filter 620 is less than N degrees in the first frequency band. In the these aspects, the absolute impedance phase difference is given by the absolute value of phase($Z_{F3}$)−phase($Z_{F2}$), where phase($Z_{F3}$) is the phase of the impedance of the third filter 620 and phase($Z_{F2}$) is the phase of the impedance of the second filter 125. In one example, N degrees is 6 degrees. In another example, N degrees is 12 degrees. In yet another example, N degrees is 18 degrees.

In certain aspects, the impedance of the second filter 125 may be defined to be similar to the impedance of the third filter 620 when the absolute impedance magnitude difference (i.e., delta) between the second filter 125 and the third filter 620 is less than M in the first frequency band. In these aspects, the absolute impedance magnitude difference is given by the absolute value of $|Z_{F3}|−|Z_{F2}|$, where $|Z_{F3}|$ is the magnitude of the impedance of the third filter 620 and $|Z_{F2}|$ is the magnitude of the impedance of the second filter 125. In one example, M is equal to 0.03. In another example M is equal to 0.07. In yet another example M is equal to 0.1.

In certain aspects, the impedance of the second filter 125 may be defined to be similar to the impedance of the third filter 620 when the absolute impedance phase difference (i.e., delta) between the second filter 125 and the third filter 620 is less than N degrees in the first frequency band and the absolute impedance magnitude difference (i.e., delta) between the second filter 125 and the third filter 620 is less than M in the first frequency band. As discussed above, N degrees may be 6 degrees, 12 degrees, or 18 degrees, and M may be equal to 0.03, 0.07, or 0.1.

Figure 8A:
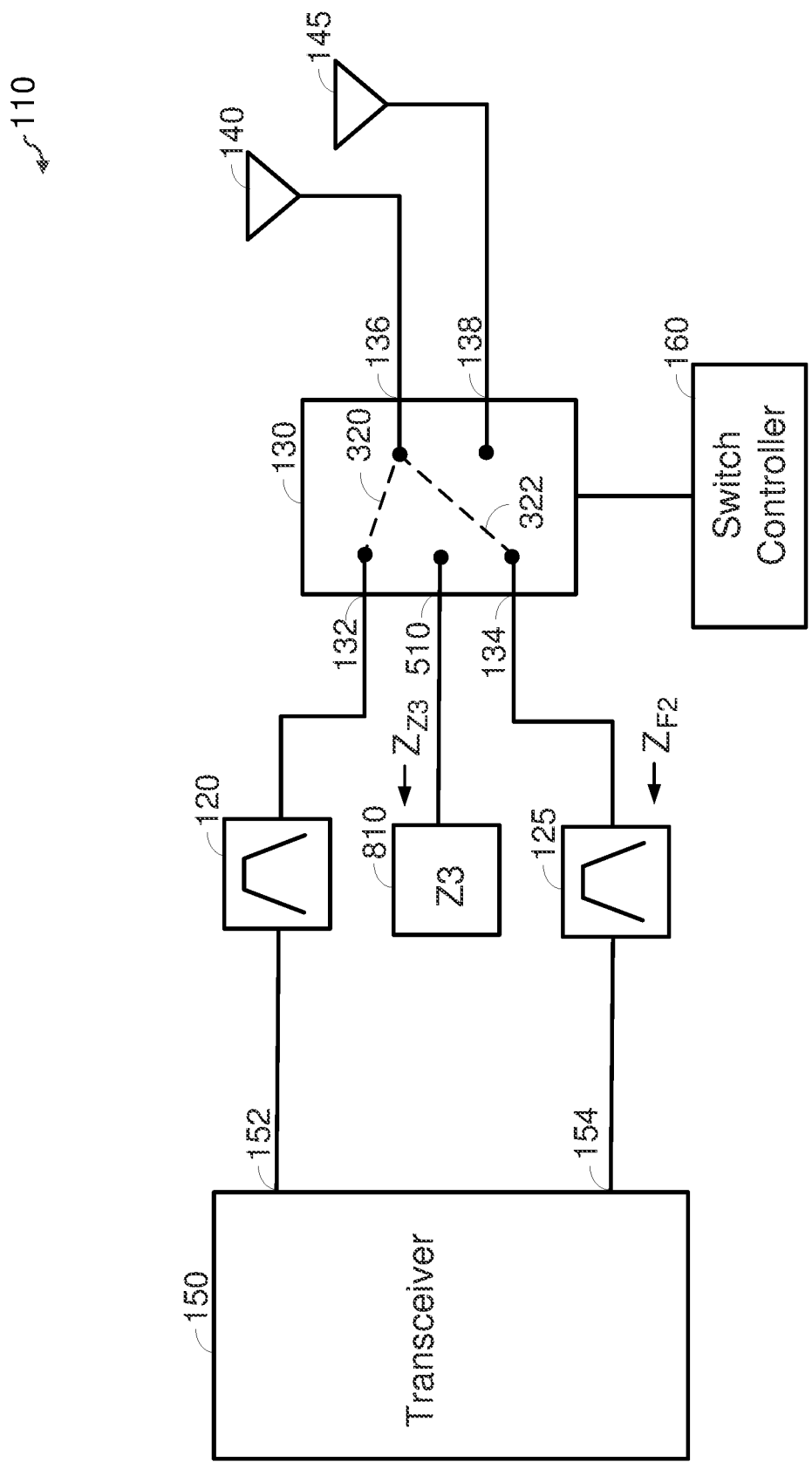
FIG. 8A shows another example of a switching circuit in a first switch configuration according to certain aspects of the present disclosure.
Figure 8B:
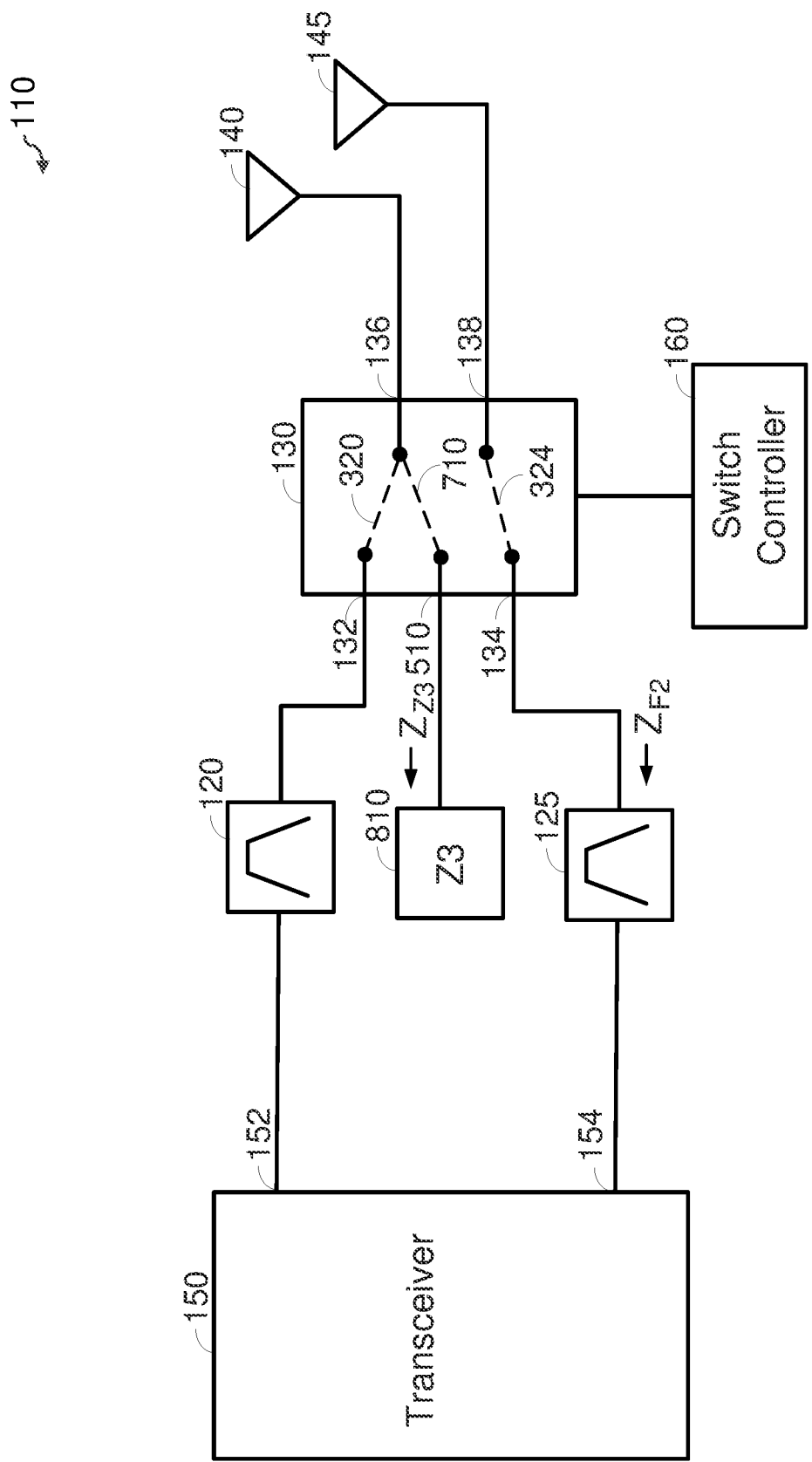
FIG. 8B shows another example of the switching circuit in a second switch configuration in which the switching circuit couples a dummy load to a filter to reduce loading change according to certain aspects of the present disclosure.

It is to be appreciated that the present disclosure is not limited to the third filter 620 to provide a dummy load for the first filter 120 in the second configuration. In this regard, FIGS. 8A and 8B show a generic dummy load 810 coupled to the fifth terminal 510 of the switching circuit 130. The dummy load 810 may be implemented with the third filter 620 or another circuit.

Figure 8C:
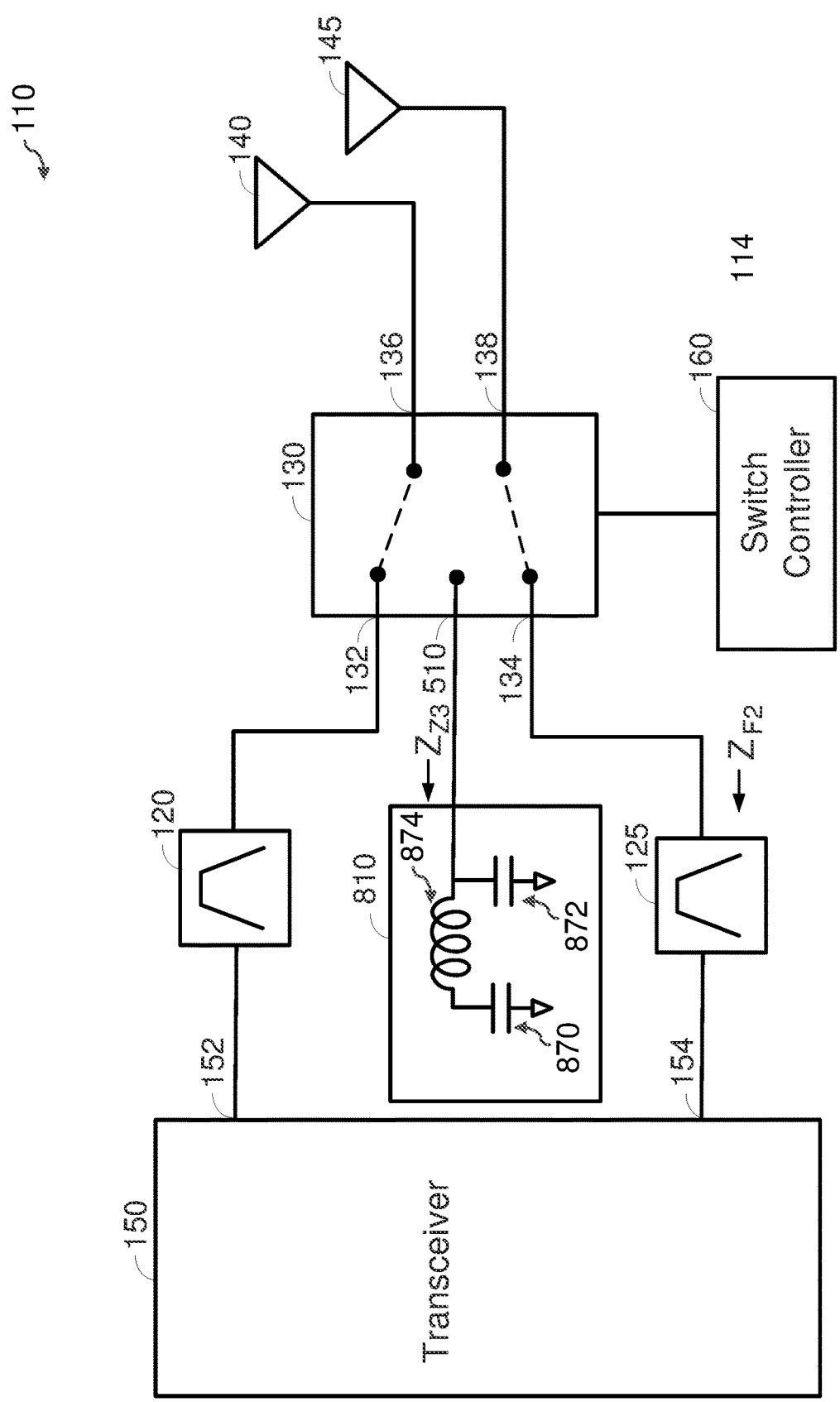
FIG. 8C shows an exemplary implementation of a dummy load according to certain aspects of the present disclosure.

In certain aspects, the dummy load 810 may be implemented with a circuit including one or more resistors, one or more inductors, and/or one or more capacitors. In this example, the resistance(s) of the one or more resistors, the inductance(s) of the one or more inductors, and/or capacitance(s) of the one or more capacitors are chosen so that the impedance (labeled "$Z_{Z3}$") looking into the dummy load 810 from the fifth terminal 510 is similar to the impedance (labeled "$Z_{F2}$") looking into the second filter 125 from the second terminal 134 in the first frequency band. The one or more resistors, one or more inductors, and/or one or more capacitors may be arranged in various configurations including a Pi network, a T network, and the like. In this regard, FIG. 8C shows an example in which the dummy load 810 includes a first capacitor 870, a second capacitor 872, and an inductor 874 coupled in a Pi network. In this example, the capacitance of the first capacitor 870, the capacitance of the second capacitor 872, and the inductance of the inductor 874 may be chosen such that the impedance $Z_{Z3}$ is similar to the impedance $Z_{F2}$ in the first frequency band. It is to be appreciated that the dummy load 810 is not limited to the example shown in FIG. 8C.

FIG. 8A shows the switching circuit 130 in the first switch configuration. In the first switch configuration, the switching circuit 130 couples the first filter 120 and the second filter 125 to the first antenna 140, in which the second filter 125 loads the first filter 120 through the switching circuit 130. The dummy load 810 is decoupled from the first antenna 140 in the first switch configuration.

FIG. 8B shows the switching circuit 130 in the second switch configuration. In the second switch configuration, the switching circuit 130 couples the fifth terminal 510 to the third terminal 136, which causes the dummy load 810 to load the first filter 120 through the switching circuit 130. The loading on the first filter 120 by the third filter 620 in the second switch configuration mitigates the loading change due to switching from the first switch configuration to the second switch configuration. The second filter 125 is decoupled from the first antenna 140 in the second switch configuration.

In certain aspects, the impedance of the second filter 125 may be defined to be similar to the impedance of the dummy load 810 when the absolute impedance phase difference (i.e., delta) between the second filter 125 and the dummy load 810 is less than N degrees in the first frequency band. In the these aspects, the absolute impedance phase difference is given by the absolute value of phase($Z_{Z3}$)–phase($Z_{F2}$), where phase ($Z_{Z3}$) is the phase of the impedance of the dummy load 810 and phase($Z_{F2}$) is the phase of the impedance of the second filter 125. In one example, N degrees is 6 degrees. In another example, N degrees is 12 degrees. In yet another example, N degrees is 18 degrees.

In certain aspects, the impedance of the second filter 125 may be defined to be similar to the impedance of the dummy load 810 when the absolute impedance magnitude difference (i.e., delta) between the second filter 125 and the dummy load 810 is less than M in the first frequency band. In these aspects, the absolute impedance magnitude difference is given by the absolute value of $|Z_{Z3}|-|Z_{F2}|$, where $|Z_{Z3}|$ is the magnitude of the impedance of the dummy load 810 and $|Z_{F2}|$ is the magnitude of the impedance of the second filter 125. In one example, M is equal to 0.03. In another example M is equal to 0.07. In yet another example M is equal to 0.1.

In certain aspects, the impedance of the second filter 125 may be defined to be similar to the impedance of the dummy load 810 when the absolute impedance phase difference (i.e., delta) between the second filter 125 and the dummy load 810 is less than N degrees in the first frequency band and the absolute impedance magnitude difference (i.e., delta) between the second filter 125 and the dummy load 810 is less than M in the first frequency band. As discussed above, N degrees may be 6 degrees, 12 degrees, or 18 degrees, and M may be equal to 0.03, 0.07, or 0.1.

Figure 9:
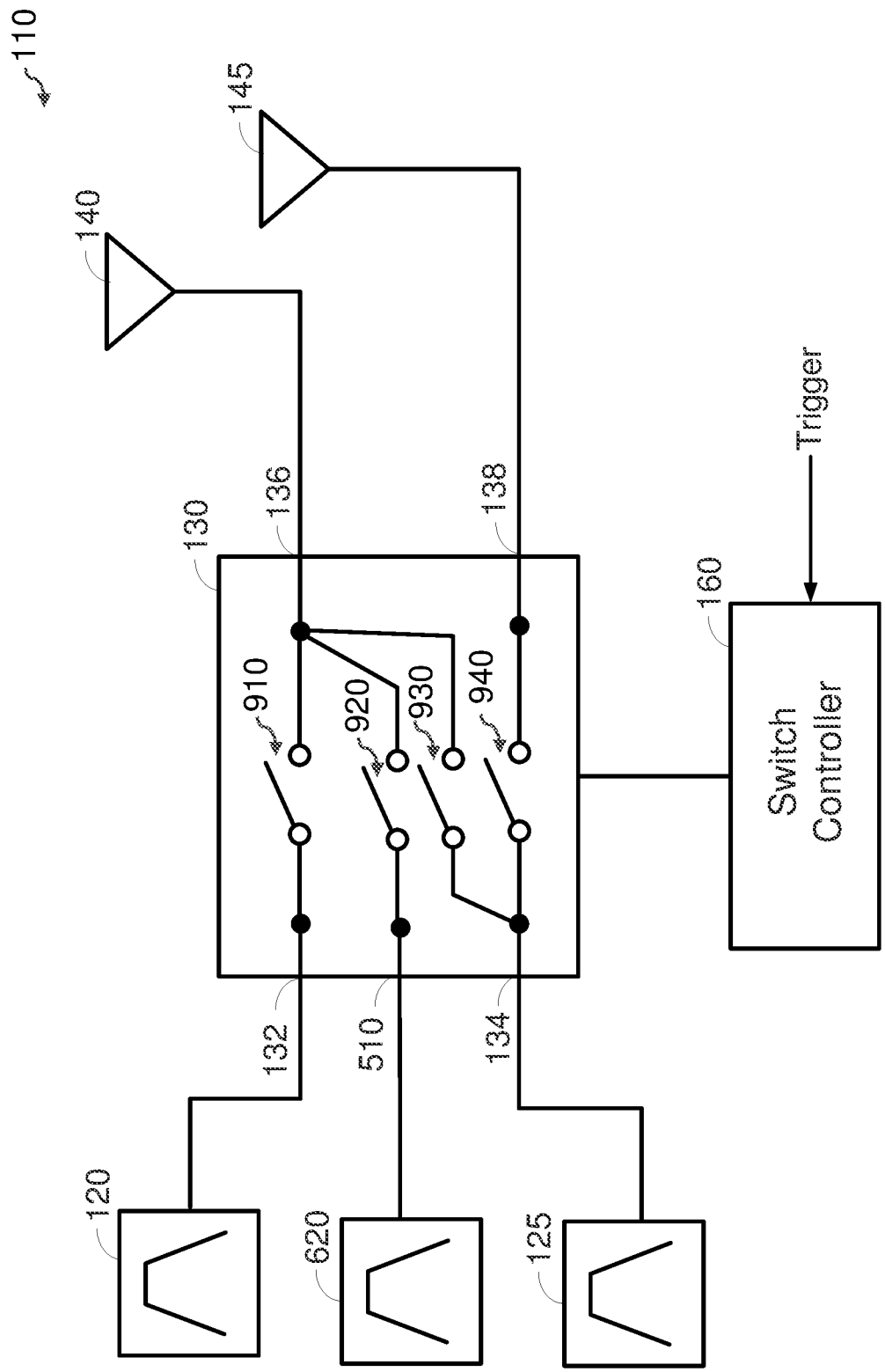
FIG. 9 shows an exemplary implementation of a switching circuit according to certain aspects of the present disclosure.

FIG. 9 shows an exemplary implementation of the switching circuit 130 according to certain aspects. In this example, the switching circuit 130 includes a first switch 910, a second switch 920, a third switch 930, and a fourth switch 940. The first switch 910 is coupled between the first terminal 132 and the third terminal 136, the second switch 920 is coupled between the fifth terminal 510 and the third terminal 136, the third switch 930 is coupled between the second terminal 134 and the third terminal 136, and the fourth switch 940 is coupled between the second terminal 134 and the fourth terminal 138. It is to be appreciated that the switching circuit 130 may include one or more additional switches not shown in FIG. 9 to support various switch configurations. For example, the switching circuit 130 may further include a switch (not shown) coupled between the first terminal 132 and the fourth terminal 138, a switch (not shown) coupled between the fifth terminal 510 and the fourth terminal 138, etc.

Each of the switches 910, 920, 930, and 940 may be implemented with a transistor, a transmission gate, or another type of switch. The switch controller 160 controls the switch configuration of the switching circuit 130 by controlling the on/off state of each of the switches 910, 920, 930, and 940. For the example where each of the switches 910, 920, 930, and 940 is implemented with a respective transistor, the switch controller 160 controls the on/off state of each of the switches 910, 920, 930, and 940 by controlling the gate voltage of the respective transistor. In this example, the switch controller 160 may be coupled to the gates of the transistors implementing the switches 910, 920, 930, and 940. For ease of illustration, the individual connections between the switch controller 160 and the switches 910, 920, 930, and 940 are not explicitly shown in FIG. 9.

To place the switching circuit in the first switch configuration illustrated in FIGS. 7A and 8A, the switch controller 160 turns on the first switch 910 and the third switch 930, and turns off the second switch 920 and the fourth switch 940. To place the switch circuit in the second switch configuration illustrated in FIGS. 7B and 8B, the switch controller 160 turns on the first switch 910, the second switch 920, and the fourth switch 940, and turns off the third switch 930.

In certain aspects, the switch controller 160 is configured to receive a trigger signal (labeled "trigger") and to switch the switching circuit 130 from the first switch configuration to the second switch configuration in response to the trigger signal. In one example, the trigger signal may include a digital signal in which the switch controller 160 switches the switching circuit 130 from the first switch configuration to the second switch configuration in response to a rising edge or a falling edge of the trigger signal. In this example, a rising edge is a transition from low (e.g., a voltage approximately equal to ground) to high (e.g., a voltage approximately equal to a supply voltage) and a falling edge is a transition from high to low. In another example, the trigger signal may include a multi-bit digital signal in which the switch controller 160 switches the switching circuit 130 from the first switch configuration to the second switch configuration in response to the trigger signal having a predefined multi-bit value. For the example of SRS switching, the trigger signal may come from an SRS controller (not shown) configured to switch transmission of the SRS between the antennas 140 and 145. In this example, the SRS controller may output the trigger signal to the switch controller 160 to switch transmission of the SRS from the first antenna 140 to the second antenna 145.

Figure 10:
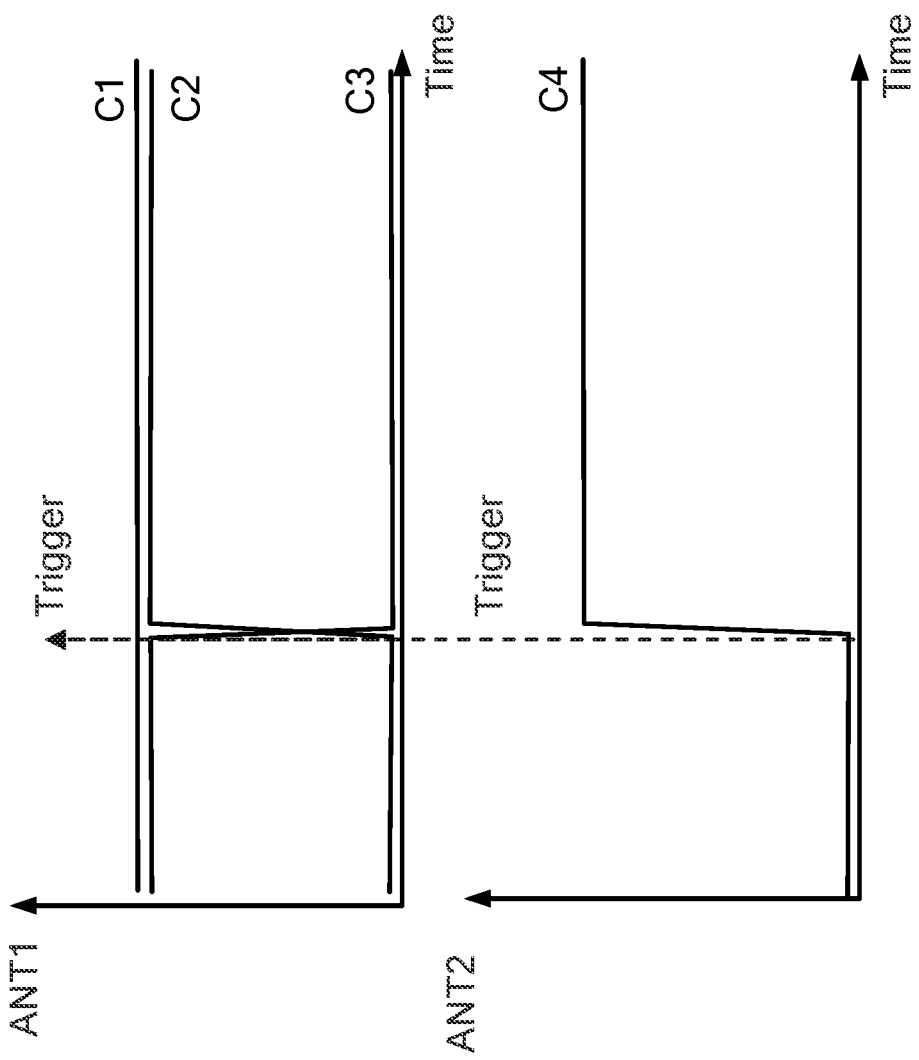
FIG. 10 illustrates an example of switching in response to a trigger signal according to certain aspects of the present disclosure.

An example of switching in response to a trigger signal is illustrated in FIG. 10. FIG. 10 is a timing diagram showing an example of a first control signal (labeled "C1") controlling the first switch 910, a second control signal (labeled "C2") controlling the second switch 920, a third control signal (labeled "C3") controlling the third switch 930, and a fourth control signal (labeled "C4") controlling the fourth switch 940.

In the example in FIG. 10, a switch is turned on when the respective control signal is high and turned off when the respective control signal is low. However, it is to be appreciated that the present disclosure is not limited to this example. In FIG. 10, the control signals for the switches 910, 920, and 930 are shown in the plot labeled "ANT1" since these switches are coupled to the first antenna 140 via the third terminal 136, and the control signal for the fourth switch 940 is shown in the plot labeled "ANT2" since the fourth switch 940 is coupled to the second antenna 145 via the fourth terminal 138.

In the example in FIG. 10, the switching circuit 130 is in the first switch configuration before the trigger signal. In response to the trigger signal, the switch controller 160 switches the switching circuit 130 to the second switch configuration. Before the trigger signal, the switch controller 160 sets the control signals for the first switch 910 and the third switch 930 high, and sets the control signals for the second switch 920 and the fourth switch 940 low. As a result, the first switch 910 and the third switch 930 are on, and the second switch 920 and the fourth switch 940 are off.

In response to the trigger signal, the switch controller 160 switches the control signal for the second switch 920 and the fourth switch 940 from low to high, and switches the control signal for the third switch from high to low. The switch controller 160 leaves the control signal for the first switch 910 high. Thus, in response to the trigger signal the switch controller 160 turns on the second switch 920 and the fourth switch 940, and turns off the third switch 930 while leaving the first switch 910 on.

Figure 11:
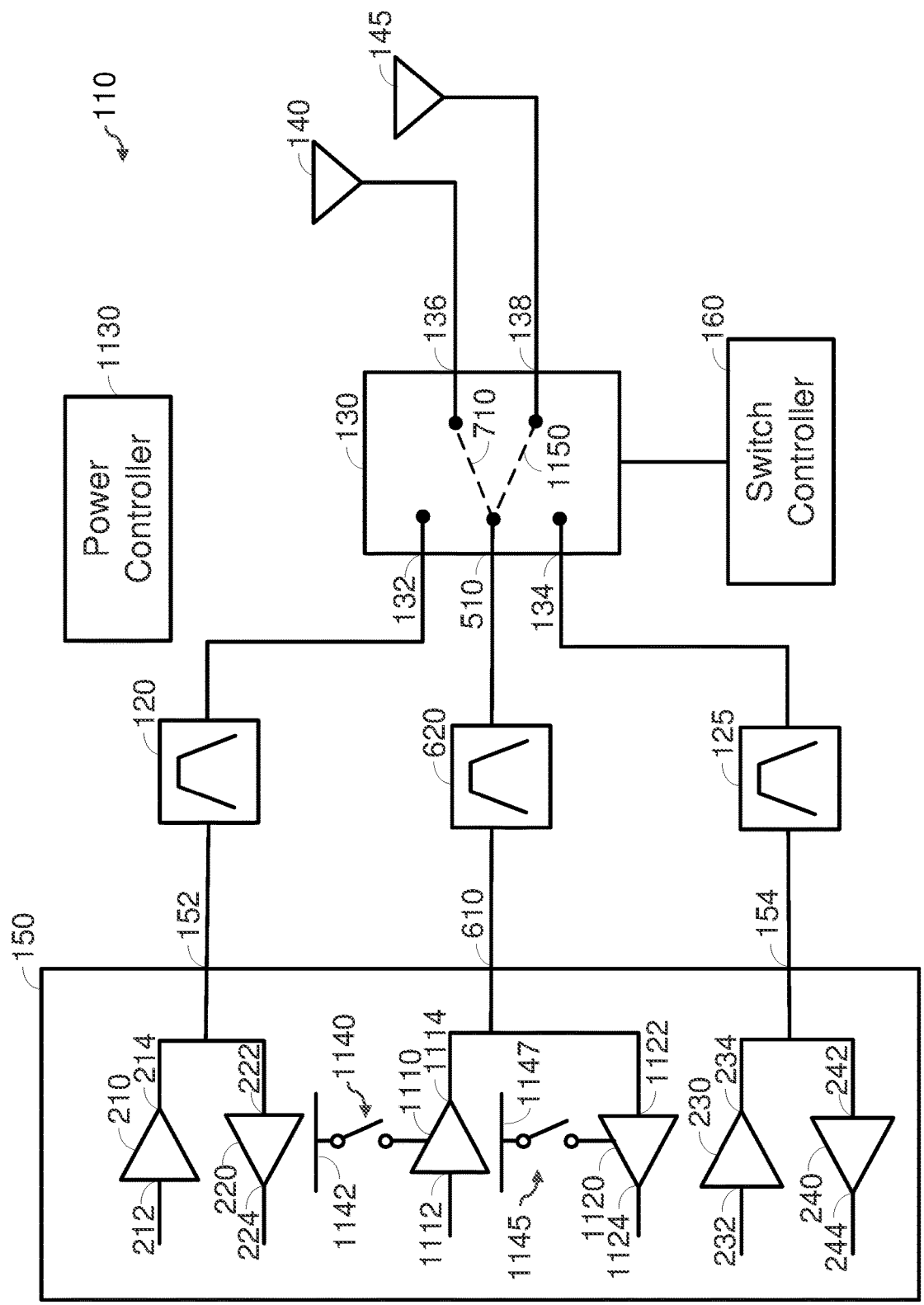
FIG. 11 shows another exemplary implementation of the transceiver according to certain aspects of the present disclosure.

FIG. 11 shows an example in which the transceiver 150 includes third power amplifier 1110 and a third LNA 1120. In this example, the transceiver 150 may also include the first power amplifier 210, the second power amplifier 230, the first LNA 220, and/or the second LNA 240 discussed above with reference to FIG. 2. In this example, the output 1114 of the third power amplifier 1110 is coupled to the third terminal 610, and the input 1122 of the third LNA 1120 is coupled to the third terminal 610. The third power amplifier 1110 is configured to receive an RF signal at the input 1112, amplify the RF signal, and output the amplified RF signal at the output 1114 (which is coupled to the third terminal 610) for wireless transmission vias one or more of the antennas 140 and 145. The third LNA 1120 is configured to receive an RF signal at the input 1122 via the third terminal 610, amplify the received RF signal, and output the amplified RF signal at the output 1124 (e.g., to a mixer or another component in the transceiver 150). It is to be appreciated that one of the third power amplifier 1110 and the third LNA 1120 may be omitted in some implementations.

In certain aspects, the wireless device 110 may also include a power controller 1130 configured to control power to the third power amplifier 1110 and/or the third LNA 1120. In one example, the power controller 1130 may control power to the third power amplifier 1110 by controlling the on/off state of a power switch 1140 coupled between the third power amplifier 1110 and a first supply rail 1142. In this example, the power controller 1130 turns on the third power amplifier 1110 by turning on the power switch 1140 and turns off the third power amplifier 1110 by turning off the power switch 1140. The power controller 1130 may control power to the third LNA 1120 by controlling the on/off state of a power switch 1145 coupled between the third LNA 1120 and a second supply rail 1147. In this example, the power controller 1130 turns on the third LNA 1120 by turning on the power switch 1145 and turns off the third LNA 1120 by turning off the power switch 1145. For ease of illustration, the individual connections between the power controller 1130 and the switches 1140 and 1145 are not shown in FIG. 11. It is to be appreciated that the present disclosure is not limited to this example, and that the power controller 1130 may control power to the third power amplifier 1110 and the third LNA using other techniques.

In one example, the power controller 1130 may turn on (i.e., activate) the third power amplifier 1110 when the wireless device 110 transmits an RF signal in the third frequency band via the third filter 620. In this case, the switch controller 160 may place the switching circuit 130 in a third switch configuration in which the switching circuit 130 couples the fifth terminal 510 to the third terminal 136 to transmit the RF signal via the first antenna 140 and/or couples the fifth terminal 510 to the fourth terminal 138 to transmit the RF signal via the second antenna 145. In FIG. 11, the coupling between the fifth terminal 510 and the fourth terminal 138 is represented by dashed line 1150.

The power controller 1130 may turn on (i.e., activate) the third LNA 1120 when the wireless device 110 receives an RF signal in the third frequency band via the third filter 620. In this case, the switch controller 160 may place the switching circuit 130 in the third switch configuration in which the switching circuit 130 couples the fifth terminal 510 to the third terminal 136 to receive the RF signal from the first antenna 140 and/or couples the fifth terminal 510 to the fourth terminal 138 to receive the RF signal from the second antenna 145.

For the example where the third filter 620 is not used for transmission or reception in the second switch configuration, the power controller 1130 may turn off (i.e., deactivate) the third power amplifier 1110 and/or turn off (i.e., deactivate) the third LNA 1120 in the second configuration to conserve power. As discussed above, the third filter 620 is used as a dummy load in the second configuration to reduce the loading change between the first switch configuration and the second switch configuration.

Figure 12:
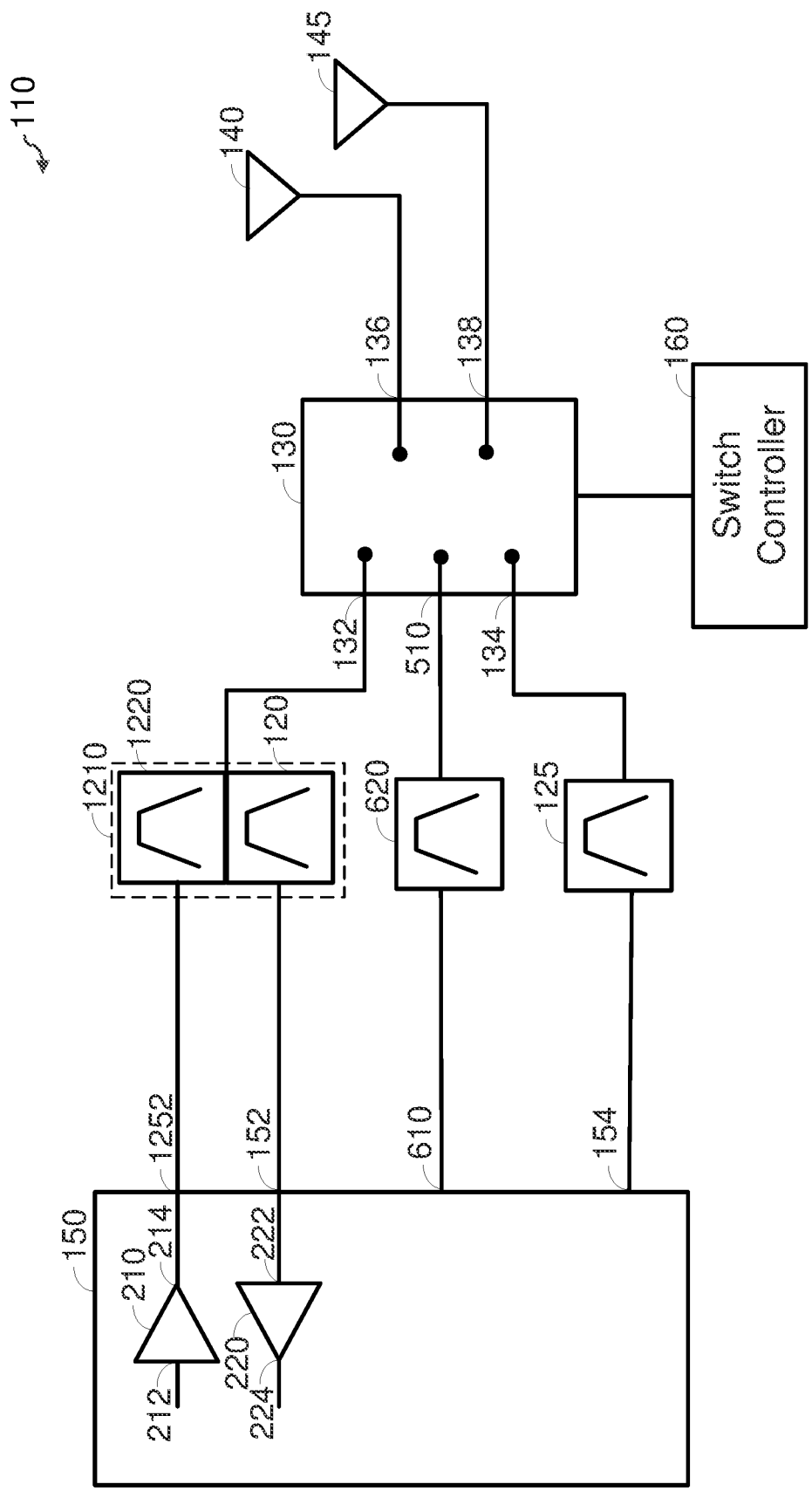
FIG. 12 shows an example in which the wireless device includes a duplexer according to certain aspects of the present disclosure.

In certain aspects, the first filter 120 may be part of a duplexer 1210 (e.g., used for FDD), an example of which is shown in FIG. 12. In this example, the duplexer 1210 includes the first filter 120 and a fourth filter 1220. In this example, the first filter 120 may be used to receive an RF signal in a first frequency band and the fourth filter 1220 may be used to transmit an RF signal in a fourth frequency band. Using the example of the LTE frequency band B1 used for FDD, the first frequency band includes at least a portion the downlink portion of band B1 (e.g., 2100-2170 MHz) and the fourth frequency band includes at least a portion of the uplink portion of band B1 (e.g., 1920-1980 MHz). However, it is to be appreciated that the present disclosure is not limited to this example, and that the duplexer 1210 may be used for any one of the other LTE frequency bands employing FDD (e.g., frequency bands B2 to B28), any one of the NR frequency bands employing FDD, and the like.

In the example in FIG. 12, the first filter 120 is coupled between the input 222 of the first LNA 220 and the first terminal 132 of the switching circuit 130. In this example, the first LNA 220 is configured to receive an RF signal in the first frequency band (e.g., downlink portion of band B1) and amplify the received RF signal.

The fourth filter 1220 is coupled between a fourth terminal 1252 of the transceiver 150 and the first terminal 132 of the switching circuit 130. In this example, the fourth terminal 1252 is coupled to the output 214 of the first power amplifier 210. The first power amplifier 210 is configured to amplify an RF signal in the fourth frequency band (e.g., uplink portion of band B1) and output the amplified RF signal to the fourth filter 1220 via the fourth terminal 1252 for wireless transmission.

It is to be appreciated that the present disclosure is not limited to a duplexer, and that the wireless device 110 may also include one or more triplexers, one or more quadplexers, one or more multiplexers, any combination thereof, and/or the like.

Figure 13:
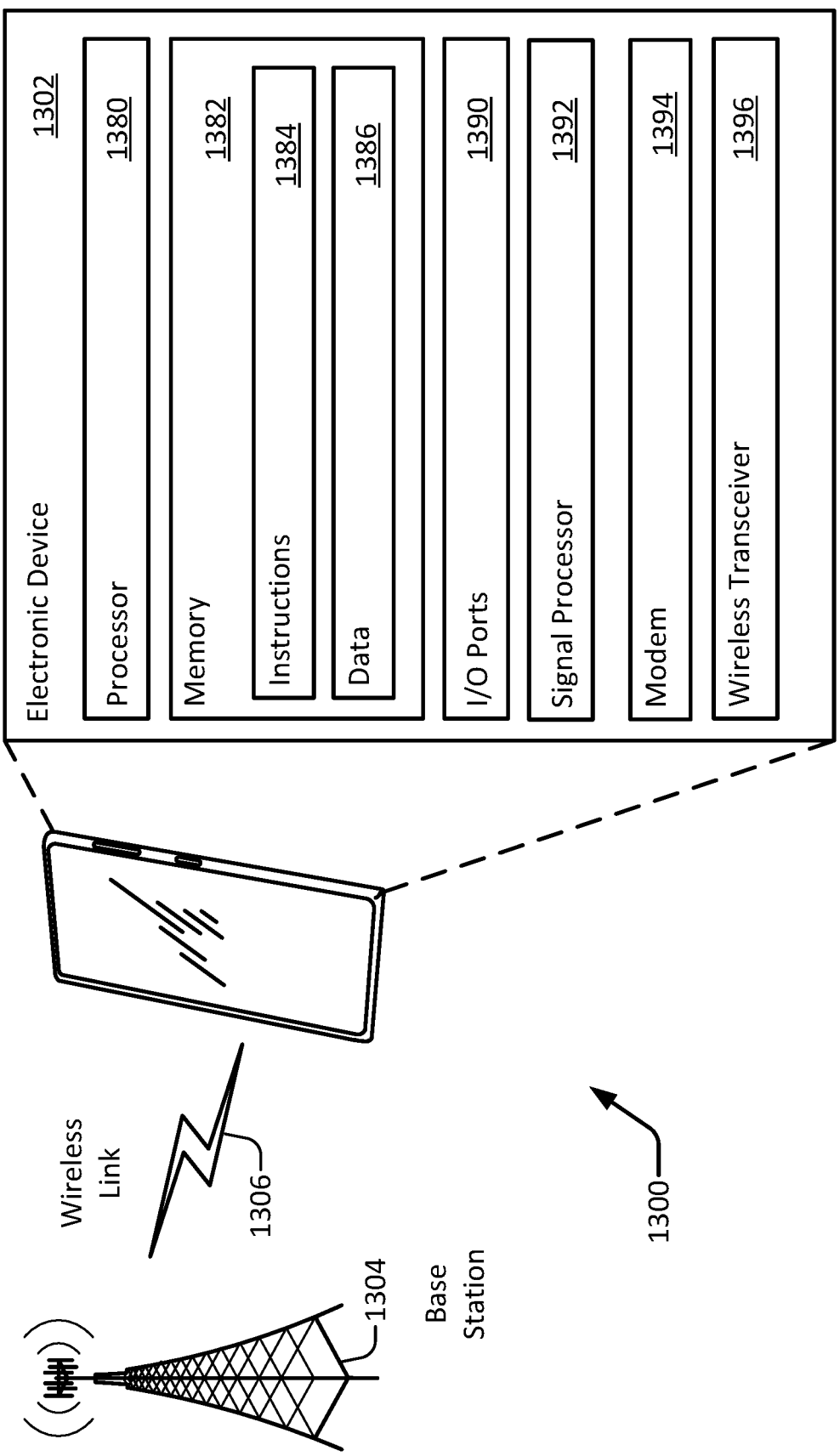
FIG. 13 is a diagram of an environment including an electronic device that includes a transceiver according to certain aspects of the present disclosure.

FIG. 13 is a diagram of an environment 1300 that includes an electronic device 1302 and a base station 1304. The electronic device 1302 may include the wireless device 110 including the transceiver 150, two or more of the filters 120, 125, 620, and 1250, the switching circuit 130, the antennas 140 and 145, and/or the dummy load 810.

In the environment 1300, the electronic device 1302 communicates with the base station 1304 (e.g., base station 310) via a wireless link 1306. As shown, the electronic device 1302 is depicted as a smart phone. However, the electronic device 1302 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1304 communicates with the electronic device 1302 via the wireless link 1306, which may be implemented as any suitable type of wireless link. Although depicted as a base station tower of a cellular radio network, the base station 1304 may represent or be implemented as another device, such as a satellite, terrestrial broadcast tower, access point, peer to peer device, mesh network node, fiber optic line, another electronic device generally as described above, and so forth. Hence, the electronic device 1302 may communicate with the base station 1304 or another device via a wired connection, a wireless connection, or a combination thereof. The wireless link 1306 can include a downlink of data or control information communicated from the base station 1304 to the electronic device 1302 and an uplink of other data or control information communicated from the electronic device 1302 to the base station 1304. The wireless link 1306 may be implemented using any suitable communication protocol or standard, such as 3rd Generation Partnership Project Long-Term Evolution (3GPP LTE, 3GPP NR 5G), IEEE 1302.13, IEEE 1302.13, Bluetooth™, and so forth.

The electronic device 1302 includes a processor 1380 and a memory 1382. The memory 1382 may be or form a portion of a computer readable storage medium. The processor 1380 may include any type of processor, such as an application processor or a multi-core processor, that is configured to execute processor-executable instructions (e.g., code) stored in the memory 1382. The memory 1382 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1382 is implemented to store instructions 1384, data 1386, and other information of the electronic device 1302.

The electronic device 1302 may also include input/output (I/O) ports 1390. The I/O ports 1390 enable data exchanges or interaction with other devices, networks, or users or between components of the device.

The electronic device 1302 may further include a signal processor (SP) 1392 (e.g., such as a digital signal processor (DSP)). The signal processor 1392 may function similar to the processor 1380 and may be capable of executing instructions and/or processing information in conjunction with the memory 1382.

For communication purposes, the electronic device 1302 also includes a modem 1394, a wireless transceiver 1396 (e.g., the transceiver 150), and one or more antennas (e.g., antennas 140 and 145). The wireless transceiver 1396 provides connectivity to respective networks and other electronic devices connected therewith using RF wireless signals. The wireless transceiver 1396 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 14A:
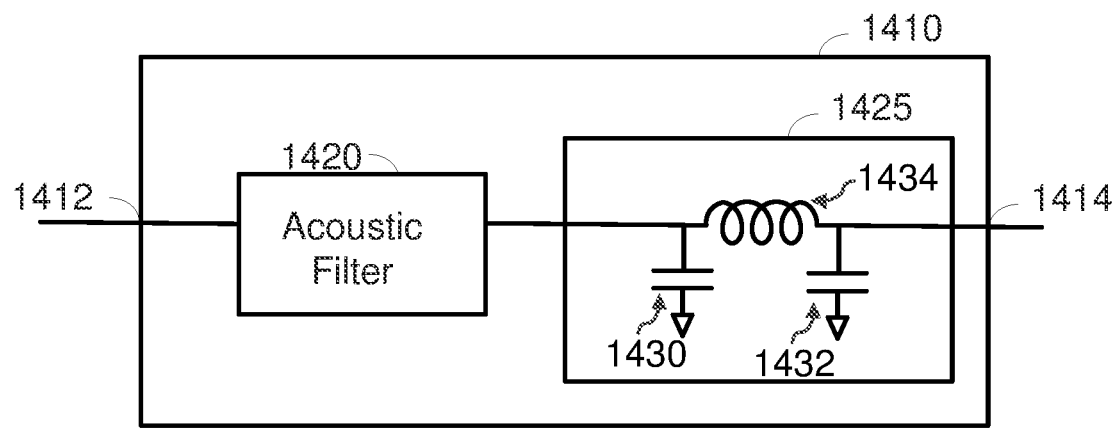
FIG. 14A shows an example of a filter including impedance matching components according to certain aspects of the present disclosure.

As discussed above, each of the filters 120, 125, and 620 may include an acoustic filter or other type of filter and impedance matching components. In this regard, FIG. 14A shows an example of a filter 1410 including an acoustic filter 1420 (e.g., SAW, BAW, and the like) and an impedance matching network 1425 including impedance matching components. The filter 1410 has a first terminal 1412 and a second terminal 1414. Each of the filters 120, 125, and 620 may be implemented with a separate instance of the filter 1410. For example, when the filter 1410 implements the first filter 120, the first terminal 1412 may be coupled to the first terminal 152 of the transceiver 150 and the second terminal 1414 may be coupled to the first terminal 132 of the switching circuit 130. When the filter 1410 implements the second filter 125, the first terminal 1412 may be coupled to the second terminal 154 of the transceiver 150 and the second terminal 1414 may be coupled to the second terminal 134 of the switching circuit 130. When the filter 1410 implements the third filter 620, the first terminal 1412 may be coupled to the third terminal 610 of the transceiver 150 and the second terminal 1414 may be coupled to the fifth terminal 510 of the switching circuit 130.

In this example, the acoustic filter 1420 is coupled between the first terminal 1412 and the impedance matching network 1425, and the impedance matching network 1425 is coupled between the acoustic filter 1420 and the second terminal 1414. The impedance matching network 1425 may be configured to provide impedance matching between the acoustic filter 1420 and the switching circuit 130.

In the example in FIG. 14A, the impedance matching components in the impedance matching network 1425 include a first capacitor 1430, a second capacitor 1432, and an inductor 1434 coupled in a Pi network, in which the inductor 1434 is coupled between the acoustic filter 1420 and the second terminal 1414, the first capacitor 1430 is coupled between the acoustic filter 1420 and ground, and the second capacitor 1432 is coupled between the second terminal 1414 and ground. In this example, the capacitance of the first capacitor 1430, the capacitance of the second capacitor 1432, and the inductance of the inductor 1434 may be chosen to provide impedance matching between the acoustic filter 1420 and the switching circuit 130. It is to be appreciated that the impedance matching network 1425 is not limited to the example shown in FIG. 14A. For example, one of the first capacitor 1430 and the second capacitor 1432 may be omitted in some implementations.

Figure 14B:
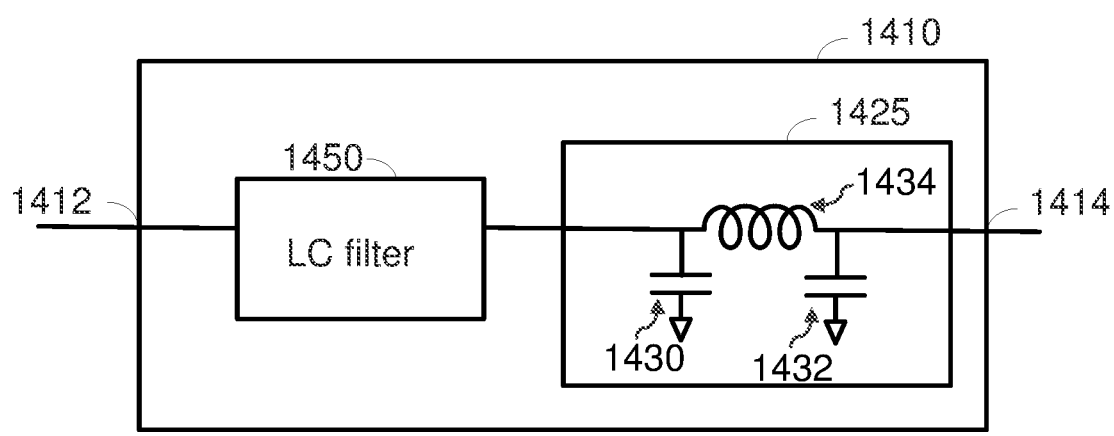
FIG. 14B shows another example of a filter including impedance matching components according to certain aspects of the present disclosure.

It is to be appreciated that the filter 1410 is not limited to the acoustic filter 1420, and that other type filters may be used. In this regard, FIG. 14B shows an example in which the filter 1410 includes an LC filter 1450 coupled between the first terminal 1412 and the impedance matching network 1425.

Figure 15:
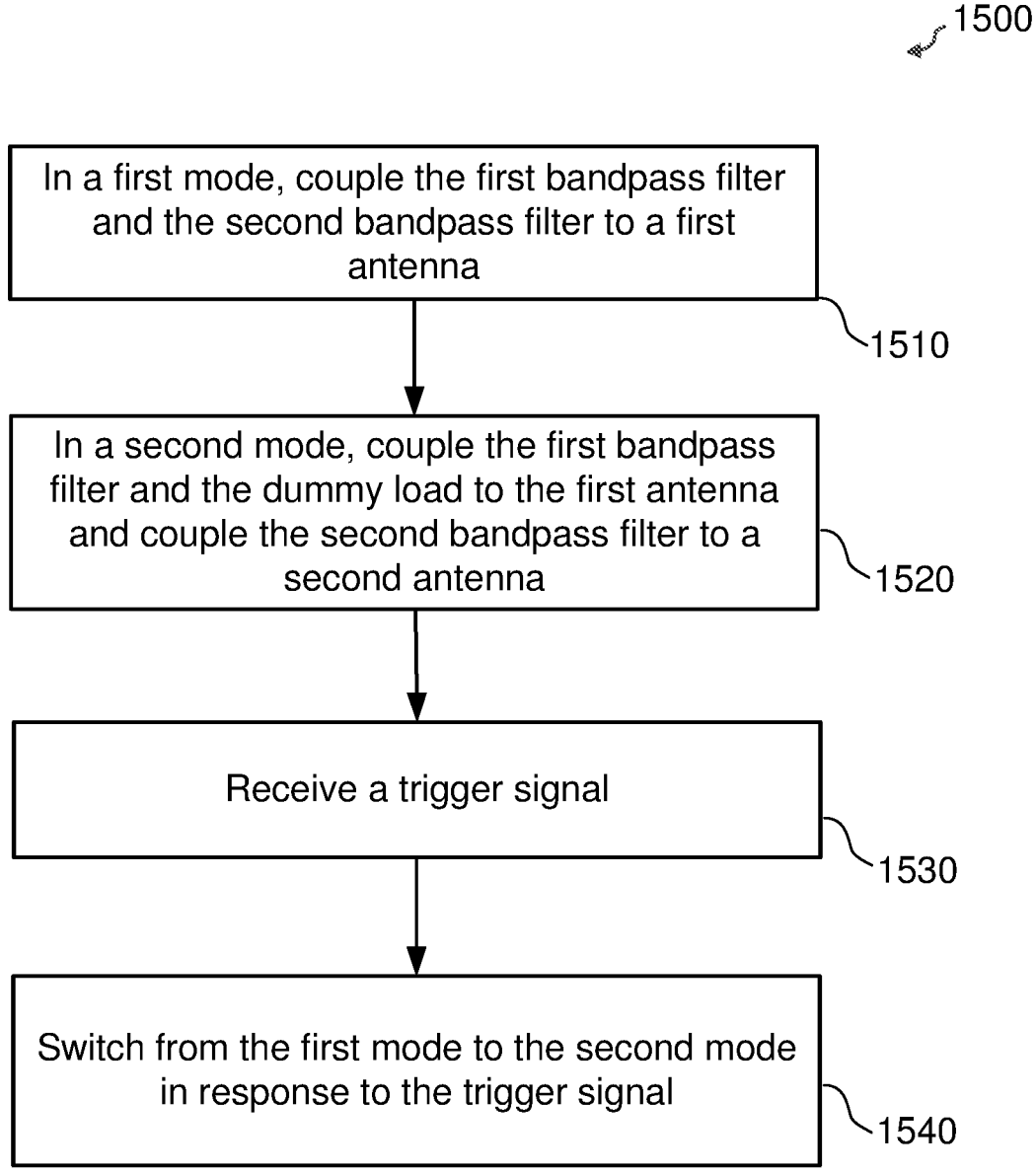
FIG. 15 is a flowchart illustrating a method of operation of a system according to certain aspects of the present disclosure.

FIG. 15 illustrates a method 1500 of operation of a system. The system includes a first bandpass filter (e.g., first filter 120) having a first frequency band, a second bandpass filter (e.g., second filter 125) having a second frequency band different from the first frequency band, and a dummy load (e.g., dummy load 810).

At block 1510, in a first mode, the first bandpass filter and the second bandpass filter are coupled to a first antenna. For example, the first bandpass filter and the second bandpass filter may be coupled to the first antenna (e.g., first antenna 140) by the switching circuit 130.

At block 1520, in a second mode, the first bandpass filter and the dummy load are coupled to the first antenna and the second bandpass filter is coupled to a second antenna. For example, the first bandpass filter and the dummy load may be coupled to the first antenna by the switching circuit 130 and the second bandpass filter may be coupled to the second antenna (e.g., second antenna 145) by the switching circuit 130.

At block 1530, a trigger signal is received. For example, the trigger signal may be received by the switch controller 160.

At block 1540, the first mode is switched to the second mode in response to the trigger signal. For example, the switch controller 160 may switch the switching circuit 130 from the first mode to the second mode in response to the trigger signal. The first mode may correspond to the first switch configuration and the second mode may correspond to the second switch configuration.

In certain aspects, the dummy load includes a third bandpass filter (e.g., third filter 620) having a third frequency band at least partially overlapping the second frequency band.

The switch controller 160 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
   a first filter;
   a second filter;
   a third filter; and
   a switching circuit having a first terminal, a second terminal, a third terminal, a fourth terminal, and a fifth terminal, wherein:
   the first terminal is coupled to the first filter, the second terminal is coupled to the second filter, the third terminal is coupled to a first antenna, the fourth terminal is coupled to a second antenna, and the fifth terminal is coupled to the third filter;
   in a first switch configuration, the switching circuit is configured to couple the first terminal to the third terminal, and couple the second terminal to the third terminal; and
   in a second switch configuration, the switching circuit is configured to couple the first terminal to the third terminal, couple the second terminal to the fourth terminal, and couple the fifth terminal to the third terminal.

2. The system of clause 1, wherein:
   the first filter comprises a first bandpass filter having a first frequency band; and
   an impedance of the third filter is similar to an impedance of the second filter in the first frequency band.

3. The system of clause 1 or 2, wherein:
   the first filter comprises a first bandpass filter having a first frequency band;
   the second filter comprises a second bandpass filter having a second frequency band; and
   the third filter comprises a third bandpass filter having a third frequency band.

4. The system of clause 3, wherein the second frequency band overlaps the third frequency band.

5. The system of clause 4, wherein the first frequency band does not overlap the second frequency band.

6. The system of any one of clauses 1 to 5, further comprising a switch controller, wherein the switch controller is configured to:
   receive a trigger signal; and
   in response to the trigger signal, switch the switching circuit from the first switch configuration to the second switch configuration.

7. The system of any one of clauses 1 to 6, wherein the switching circuit comprises:
   a first switch coupled between the first terminal and the third terminal;
   a second switch coupled between the fifth terminal and the third terminal;
   a third switch coupled between the second terminal and the third terminal; and
   a fourth switch coupled between the second terminal and the fourth terminal.

8. The system of clause 7, further comprising a switch controller, wherein the switch controller is configured to:
   in the first switch configuration, turn on the first switch and the third switch, and turn off the second switch and the fourth switch; and
   in the second switch configuration, turn on the first switch, the second switch, and the fourth switch, and turn off the third switch.

9. The system of clause 8, wherein the switch controller is further configured to:
   receive a trigger signal; and
   in response to the trigger signal, switch the switching circuit from the first switch configuration to the second switch configuration.

10. The system of any one of clauses 1 to 9, further comprising a transceiver, wherein:
    the first filter is coupled between the transceiver and the first terminal;
    the second filter is coupled between the transceiver and the second terminal;
    the transceiver is configured to receive a first radio frequency (RF) signal via the first filter in the first switch configuration and the second switch configuration; and
    the transceiver is configured to output a second RF signal to the second filter in the first switch configuration and the second switch configuration.

11. The system of clause 10, wherein the second RF signal includes a sounding reference signal.

12. A system, comprising:
    a first filter;
    a second filter;
    a dummy load;
    a switching circuit having a first terminal, a second terminal, a third terminal, a fourth terminal, and a fifth terminal, wherein:
    the first terminal is coupled to the first filter, the second terminal is coupled to the second filter, the third terminal is coupled to a first antenna, the fourth terminal is coupled to a second antenna, and the fifth terminal is coupled to the dummy load;

in a first switch configuration, the switching circuit is configured to couple the first terminal to the third terminal, and couple the second terminal to the third terminal; and in a second switch configuration, the switching circuit is configured to couple the first terminal to the third terminal, couple the second terminal to the fourth terminal, and couple the fifth terminal to the third terminal; and a switch controller, wherein the switch controller is configured to:
receive a trigger signal; and
in response to the trigger signal, switch the switching circuit from the first switch configuration to the second switch configuration.

13. The system of clause 12, wherein the dummy load comprises a third filter.

14. The system of clause 12 or 13, wherein the switching circuit comprises:
a first switch coupled between the first terminal and the third terminal;
a second switch coupled between the fifth terminal and the third terminal;
a third switch coupled between the second terminal and the third terminal; and
a fourth switch coupled between the second terminal and the fourth terminal.

15. The system of clause 14, wherein the switch controller is configured to:
in the first switch configuration, turn on the first switch and the third switch, and turn off the second switch and the fourth switch; and
in the second switch configuration, turn on the first switch, the second switch, and the fourth switch, and turn off the third switch.

16. The system of any one of clauses 12 to 15, wherein:
the first filter comprises a first bandpass filter having a first frequency band; and
an impedance of the dummy load is similar to an impedance of the second filter in the first frequency band.

17. The system of any one of clauses 12 to 16, further comprising a transceiver, wherein:
the first filter is coupled between the transceiver and the first terminal;
the second filter is coupled between the transceiver and the second terminal;
the transceiver is configured to receive a first radio frequency (RF) signal via the first filter in the first switch configuration and the second switch configuration; and
the transceiver is configured to output a second RF signal to the second filter in the first switch configuration and the second switch configuration.

18. The system of clause 17, wherein the second RF signal includes a sounding reference signal.

19. A system, comprising:
a first bandpass filter having a first frequency band;
a second bandpass filter having a second frequency band different from the first frequency band;
a third bandpass filter having a third frequency band at least partially overlapping the second frequency band;
a switching circuit coupled to the first bandpass filter, the second bandpass filter, and the third bandpass filter, and coupled to a first antenna and a second antenna; and a switch controller configured to:
cause the switching circuit to operably couple the first bandpass filter and the second bandpass filter to the first antenna in a first mode; and
cause the switching circuit to operably couple the first bandpass filter and the third bandpass filter to the first antenna and operably couple the second bandpass filter to the second antenna in a second mode.

20. The system of clause 19, wherein the switch controller is configured to:
receive a trigger signal; and
in response to the trigger signal, switch the switching circuit from the first mode to the second mode.

21. A method of operation of a system, wherein the system includes a first bandpass filter having a first frequency band, a second bandpass filter having a second frequency band different from the first frequency band, and a dummy load, the method comprising:
in a first mode, coupling the first bandpass filter and the second bandpass filter to a first antenna;
in a second mode, coupling the first bandpass filter and the dummy load to the first antenna and coupling the second bandpass filter to a second antenna;
receiving a trigger signal; and
switching from the first mode to the second mode in response to the trigger signal.

22. The method of clause 21, wherein the dummy load comprises a third bandpass filter having a third frequency band at least partially overlapping the second frequency band.

23. The method of clause 21 or 22, further comprising:
in the first mode and the second mode, receiving a first radio frequency (RF) signal via the first bandpass filter and the first antenna;
in the first mode, transmitting a second RF signal via the second bandpass filter and first antenna; and
in the second mode, transmitting the second RF signal via the second bandpass filter and second antenna.

24. The method of clause 23, wherein the second RF signal includes a sounding reference signal.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A system, comprising:
a first filter;
a second filter;
a third filter;

a switching circuit having a first terminal, a second terminal, a third terminal, a fourth terminal, a fifth terminal, a first switch coupled between the first terminal and the third terminal, a second switch coupled between the fifth terminal and the third terminal, a third switch coupled between the second terminal and the third terminal, and a fourth switch coupled between the second terminal and the fourth terminal, wherein:
the first terminal is coupled to the first filter, the second terminal is coupled to the second filter, the third terminal is coupled to a first antenna, the fourth terminal is coupled to a second antenna, and the fifth terminal is coupled to the third filter;
in a first switch configuration, the switching circuit is configured to couple the first terminal to the third terminal, and couple the second terminal to the third terminal; and
in a second switch configuration, the switching circuit is configured to couple the first terminal to the third terminal, couple the second terminal to the fourth terminal, and couple the fifth terminal to the third terminal; and
a switch controller, wherein the switch controller is configured to:
in the first switch configuration, turn on the first switch and the third switch, and turn off the second switch and the fourth switch; and
in the second switch configuration, turn on the first switch, the second switch, and the fourth switch, and turn off the third switch.

2. The system of claim 1, wherein:
the first filter comprises a first bandpass filter having a first frequency band; and
an impedance of the third filter is similar to an impedance of the second filter in the first frequency band.

3. The system of claim 1, wherein:
the first filter comprises a first bandpass filter having a first frequency band;
the second filter comprises a second bandpass filter having a second frequency band; and
the third filter comprises a third bandpass filter having a third frequency band.

4. The system of claim 3, wherein the second frequency band overlaps the third frequency band.

5. The system of claim 4, wherein the first frequency band does not overlap the second frequency band.

6. The system of claim 1, wherein the switch controller is further configured to:
receive a trigger signal; and
in response to the trigger signal, switch the switching circuit from the first switch configuration to the second switch configuration.

7. The system of claim 1, further comprising a transceiver, wherein:
the first filter is coupled between the transceiver and the first terminal;
the second filter is coupled between the transceiver and the second terminal;
the transceiver is configured to receive a first radio frequency (RF) signal via the first filter in the first switch configuration and the second switch configuration; and
the transceiver is configured to output a second RF signal to the second filter in the first switch configuration and the second switch configuration.

8. The system of claim 7, wherein the second RF signal includes a sounding reference signal.

9. A system, comprising:
a first filter;
a second filter;
a dummy load;
a switching circuit having a first terminal, a second terminal, a third terminal, a fourth terminal, a fifth terminal, a first switch coupled between the first terminal and the third terminal, a second switch coupled between the fifth terminal and the third terminal, a third switch coupled between the second terminal and the third terminal, and a fourth switch coupled between the second terminal and the fourth terminal, wherein:
the first terminal is coupled to the first filter, the second terminal is coupled to the second filter, the third terminal is coupled to a first antenna, the fourth terminal is coupled to a second antenna, and the fifth terminal is coupled to the dummy load;
in a first switch configuration, the switching circuit is configured to couple the first terminal to the third terminal, and couple the second terminal to the third terminal; and
in a second switch configuration, the switching circuit is configured to couple the first terminal to the third terminal, couple the second terminal to the fourth terminal, and couple the fifth terminal to the third terminal; and
a switch controller, wherein the switch controller is configured to:
in the first switch configuration, turn on the first switch and the third switch, and turn off the second switch and the fourth switch;
in the second switch configuration, turn on the first switch, the second switch, and the fourth switch, and turn off the third switch;
receive a trigger signal; and
in response to the trigger signal, switch the switching circuit from the first switch configuration to the second switch configuration.

10. The system of claim 9, wherein the dummy load comprises a third filter.

11. The system of claim 9, wherein:
the first filter comprises a first bandpass filter having a first frequency band; and
an impedance of the dummy load is similar to an impedance of the second filter in the first frequency band.

12. The system of claim 9, further comprising a transceiver, wherein:
the first filter is coupled between the transceiver and the first terminal;
the second filter is coupled between the transceiver and the second terminal;
the transceiver is configured to receive a first radio frequency (RF) signal via the first filter in the first switch configuration and the second switch configuration; and
the transceiver is configured to output a second RF signal to the second filter in the first switch configuration and the second switch configuration.

13. The system of claim 12, wherein the second RF signal includes a sounding reference signal.

14. A system, comprising:
a first bandpass filter having a first frequency band;
a second bandpass filter having a second frequency band different from the first frequency band;
a third bandpass filter having a third frequency band at least partially overlapping the second frequency band;

a switching circuit coupled to the first bandpass filter, the second bandpass filter, and the third bandpass filter, and coupled to a first antenna and a second antenna, the switching circuit comprising a first switch coupled between the first bandpass filter and the first antenna, a second switch coupled between the third bandpass filter and the first antenna, a third switch coupled between the second bandpass filter and the first antenna, and a fourth switch coupled between the second bandpass filter and the second antenna; and a switch controller configured to:

cause the switching circuit to operably couple the first bandpass filter and the second bandpass filter to the first antenna in a first mode in response to one or more first control signals configured to turn on the first switch and the third switch, and turn off the second switch and the fourth switch; and cause the switching circuit to operably couple the first bandpass filter and the third bandpass filter to the first antenna and operably couple the second bandpass filter to the second antenna in a second mode in response to one or more second control signals configured to turn on the first switch, the second switch, and the fourth switch, and turn off the third switch.

15. The system of claim 14, wherein the switch controller is configured to:

receive a trigger signal; and in response to the trigger signal, switch the switching circuit from the first mode to the second mode.

16. A method of operation of a system, wherein the system includes a first bandpass filter having a first frequency band, a second bandpass filter having a second frequency band different from the first frequency band, and a dummy load, the method comprising:

in a first mode, coupling the first bandpass filter and the second bandpass filter to a first antenna;

in a second mode, coupling the first bandpass filter and the dummy load to the first antenna and coupling the second bandpass filter to a second antenna;

in the first mode and the second mode, receiving a first radio frequency (RF) signal via the first bandpass filter and the first antenna;

in the first mode, transmitting a second RF signal via the second bandpass filter and first antenna;

in the second mode, transmitting the second RF signal via the second bandpass filter and second antenna, wherein the second RF signal includes a sounding reference signal;

receiving a trigger signal; and switching from the first mode to the second mode in response to the trigger signal.

17. The method of claim 16, wherein the dummy load comprises a third bandpass filter having a third frequency band at least partially overlapping the second frequency band.

* * * * *